US008617721B2

(12) United States Patent
Kim et al.

(10) Patent No.: US 8,617,721 B2
(45) Date of Patent: Dec. 31, 2013

(54) ORGANIC LIGHT-EMITTING DEVICE

(75) Inventors: Tae-Shick Kim, Yongin (KR);
Dong-Heon Kim, Yongin (KR);
Kwan-Hee Lee, Yongin (KR);
Min-Seung Chun, Yongin (KR);
Mi-Kyung Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 426 days.

(21) Appl. No.: 12/902,315

(22) Filed: Oct. 12, 2010

(65) Prior Publication Data

US 2011/0084258 A1 Apr. 14, 2011

(30) Foreign Application Priority Data

Oct. 12, 2009 (KR) .................... 10-2009-0096822

(51) Int. Cl.
*H01L 51/50* (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| 6,908,783 B1 * | 6/2005 | Kuehl et al. ...................... 438/99 |
| 7,737,627 B2 | 6/2010 | Hwang et al. |
| 8,188,315 B2 * | 5/2012 | Hwang et al. .................. 564/440 |
| 8,339,031 B2 * | 12/2012 | Tchakarov et al. ............ 313/503 |
| 2002/0117962 A1 * | 8/2002 | Beierlein et al. .............. 313/504 |
| 2004/0146744 A1 | 7/2004 | Seo et al. |
| 2005/0121667 A1 | 6/2005 | Kuehl et al. |
| 2005/0139810 A1 | 6/2005 | Kuehl et al. |
| 2005/0173700 A1 * | 8/2005 | Liao et al. ........................ 257/40 |
| 2005/0221124 A1 | 10/2005 | Hwang et al. |
| 2007/0029539 A1 | 2/2007 | Yashima et al. |
| 2007/0231503 A1 * | 10/2007 | Hwang et al. .................. 428/1.1 |
| 2007/0264526 A1 | 11/2007 | Choi et al. |
| 2008/0012482 A1 | 1/2008 | Seo et al. |
| 2008/0014464 A1 * | 1/2008 | Kawamura et al. ............ 428/690 |
| 2008/0111484 A1 * | 5/2008 | Kwon et al. ................... 313/506 |

(Continued)

FOREIGN PATENT DOCUMENTS

| JP | 11-111463 A | 4/1999 |
| JP | 2005-167175 A | 6/2005 |

(Continued)

OTHER PUBLICATIONS

European Search Report in EP 10186689.5—1235/2309565, dated Jul. 18, 2012 (Kim, et al.).

(Continued)

*Primary Examiner* — Dawn L. Garrett
(74) *Attorney, Agent, or Firm* — Lee & Morse, P.C.

(57) ABSTRACT

An organic light-emitting device including a substrate; a first electrode on the substrate; a second electrode; an organic layer between the first electrode and the second electrode, the organic layer including an emission layer; and a first layer including a cyano group-containing compound, the first layer being between the first electrode and the emission layer, wherein the first electrode includes an Al-based reflective layer and a transparent conductive layer sequentially stacked on the substrate, the Al-based reflective layer including a first element and nickel (Ni), and the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

30 Claims, 5 Drawing Sheets

(56) References Cited

U.S. PATENT DOCUMENTS

| | | | |
|---|---|---|---|
| 2008/0121522 A1 | 5/2008 | Ehira et al. | |
| 2008/0171228 A1 | 7/2008 | Chen et al. | |
| 2008/0251785 A1* | 10/2008 | Noh et al. | 257/40 |
| 2009/0096357 A1* | 4/2009 | Lee et al. | 313/504 |
| 2009/0235971 A1 | 9/2009 | Pfeiffer et al. | |
| 2010/0032186 A1 | 2/2010 | Gotou et al. | |
| 2010/0072884 A1 | 3/2010 | Tchakarov et al. | |
| 2011/0084255 A1* | 4/2011 | Kim et al. | 257/40 |
| 2011/0084600 A1* | 4/2011 | Kim et al. | 313/504 |

FOREIGN PATENT DOCUMENTS

| | | | |
|---|---|---|---|
| JP | 2005-290000 A | 10/2005 | |
| JP | 2007-066883 A | 3/2007 | |
| JP | 2007-201327 A | 8/2007 | |
| JP | 2008-145647 A | 6/2008 | |
| JP | 2008-532302 A | 8/2008 | |
| JP | 2008-216490 A | 9/2008 | |
| JP | 2009-031752 A | 2/2009 | |
| JP | 2009-094456 A | 4/2009 | |
| JP | 2009-175720 A | 8/2009 | |
| KR | 10-2004-0103672 A | 12/2004 | |
| KR | 10-2005-0054427 A | 6/2005 | |
| KR | 10-2005-0097670 A | 10/2005 | |
| KR | 10-2006-0020156 A | 3/2006 | |
| KR | 10-2007-0044308 A | 4/2007 | |
| KR | 10 2007-0109785 A | 11/2007 | |
| KR | 10-2008-0045629 A | 5/2008 | |
| KR | 10-2009-0048241 A | 5/2009 | |
| KR | 10-2009-0052351 A | 5/2009 | |
| WO | WO 2006/081780 A1 | 8/2006 | |
| WO | WO 2008/029060 A2 | 3/2008 | |
| WO | WO 2009/081993 A | 7/2009 | |

OTHER PUBLICATIONS

Kugimiya, et al.; P-149: Anode electrode of Al-Ni Alloy Film Directly in Contact with ITO for Top-Emitting OLEDs; SID 09 Digest; 2009; pp. 1681-1684; ISSN/009/0966X/09/3903-1681; SID.

European Search Report in EP 10186689.5-1235/2309565, dated Mar. 23, 2012 (Kim et al.).

Japanese Office Action in JP 2010-228945 A, dated Mar. 12, 2013 (Kim, et al.).

* cited by examiner

ORGANIC LIGHT-EMITTING DEVICE

BACKGROUND

1. Field

Embodiments relate to an organic light-emitting device.

2. Description of the Related Art

Organic light-emitting devices (OLEDs), which are self-emitting devices, have advantages, e.g., a wide viewing angle, excellent contrast, quick response, high brightness, excellent driving voltage characteristics, and can provide multicolored images.

An OLED has a structure including, e.g., a substrate, and an anode, a hole transport layer (HTL), an emission layer (EML), an electron transport layer (ETL), and a cathode, which are sequentially stacked on the substrate. In this regard, the HTL, the EML, and the ETL may be, e.g., organic thin films formed of organic compounds.

An operating principle of an OLED having the above-described structure is as follows.

When a voltage is applied to the anode and the cathode, holes injected from the anode may move to the EML via the HTL; and electrons injected from the cathode may move to the EML via the ETL. The holes and electrons may recombine in the EML to generate excitons. When the excitons drop from an excited state to a ground state, light may be emitted.

SUMMARY

Embodiments are directed to an organic light-emitting device, which substantially overcome one or more of the problems due to the limitations and disadvantages of the related art.

It is a feature of an embodiment to provide an organic light-emitting device having excellent driving voltage characteristics and excellent power efficiency characteristics.

At least one of the above and other features and advantages may be realized by providing an organic light-emitting device including a substrate; a first electrode on the substrate; a second electrode; an organic layer between the first electrode and the second electrode, the organic layer including an emission layer; and a first layer including a cyano group-containing compound, the first layer being between the first electrode and the emission layer, wherein the first electrode includes an Al-based reflective layer and a transparent conductive layer sequentially stacked on the substrate, the Al-based reflective layer including a first element and nickel (Ni), and the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first electrode may further include a second element-containing zinc oxide layer, the second element including at least one of aluminum (Al), indium (In), gallium (Ga), germanium (Ge), gadolinium (Gd), zirconium (Zr), molybdenum (Mo), and nickel (Ni).

The Al-based reflective layer, the transparent conductive layer, and the second element-containing zinc oxide layer may be sequentially stacked in this order on the substrate.

The second element may be included in an amount of about 0.5 to about 10 parts by weight, based on 100 parts by weight of the second element-containing zinc oxide layer.

The Al-based reflective layer may include La, Ni, and Al.

The cyano group-containing compound may include any one of compounds represented by Formulae 1 through 20:

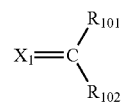

Formula 1

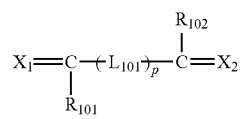

Formula 2

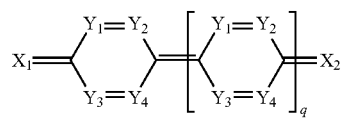

Formula 3

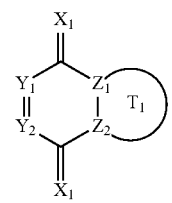

Formula 4

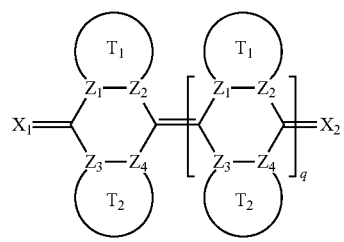

Formula 5

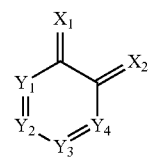

Formula 6

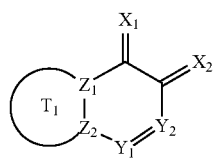

Formula 7

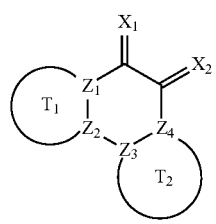

Formula 8

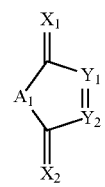

Formula 9

-continued

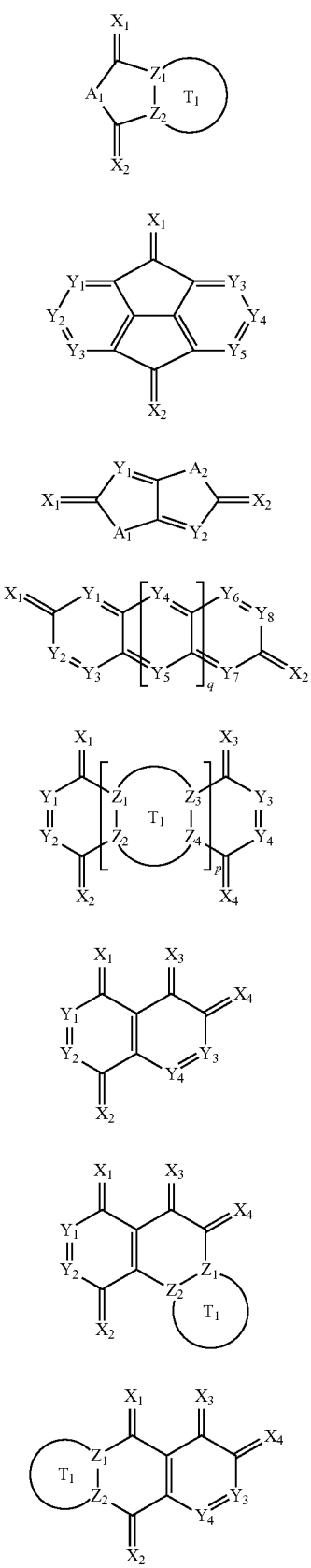

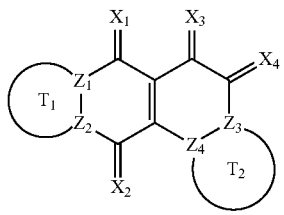

Formula 18

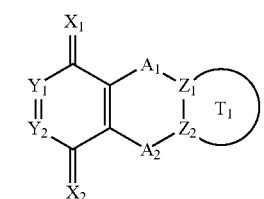

Formula 19

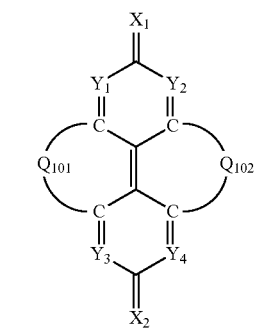

Formula 20 in Formulae 1 through 20, $X_1$ through $X_4$ may each independently be represented by one of Formulae 30A through 30D;

$Y_1$ through $Y_8$ may each independently be N or $C(R_{103})$;

$Z_1$ through $Z_4$ may each independently be C or N;

$A_1$ and $A_2$ may each independently be —O—, —S—, —N($R_{104}$), or —C($R_{105}$)($R_{106}$)—;

$Q_{101}$ and $Q_{102}$ may each independently be a $C_2$-$C_{10}$ alkylene group, a $C_2$-$C_{10}$ alkenylene group, or a $C_2$-$C_{10}$ alkylene group or $C_2$-$C_{10}$ alkenylene group substituted with at least one of a halogen atom, a cyano group, a hydroxyl group, a $C_1$-$C_{10}$ alkyl group, or a $C_1$-$C_{10}$ alkoxy group;

$T_1$ and $T_2$ may each independently be a $C_5$-$C_{30}$ aromatic ring system, a $C_2$-$C_{30}$ hetero aromatic ring system, or a $C_5$-$C_{30}$ aromatic ring system or $C_2$-$C_{30}$ hetero aromatic ring system substituted with at least one of a halogen atom, a cyano group, a hydroxyl group, a $C_1$-$C_{10}$ alkyl group, and a $C_1$-$C_{10}$ alkoxy group;

p may be an integer of 1 through 10;

q may be an integer of 0 through 10;

$R_{101}$ through $R_{106}$ may each independently be a hydrogen atom, a halogen atom, a cyano group, a hydroxyl group, a $C_1$-$C_{10}$ alkyl group, a $C_1$-$C_{10}$ alkoxy group, a $C_1$-$C_{10}$ alkyl group substituted with at least one of a halogen atom, a cyano group, a hydroxyl group, a $C_5$-$C_{14}$ aryl group, and a $C_2$-$C_{14}$ hetero aryl group, a $C_1$-$C_{10}$ alkoxy group substituted with at least one of a halogen atom, a cyano group, a hydroxyl group, a $C_5$-$C_{14}$ aryl group, and a $C_2$-$C_{14}$ hetero aryl group,

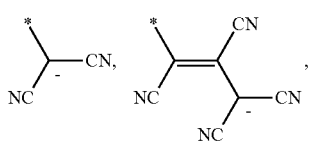 [SMILES: *[C-](C#N)C#N ; */C(C#N)=C(\C#N)[C-](C#N)C#N ; ","]

or —N($R_{107}$)($R_{108}$); $R_{107}$ and $R_{108}$ are each independently a hydrogen atom, a $C_1$-$C_{10}$ alkyl group, a phenyl group, or a biphenyl group; and $L_{101}$ may be one of a $C_5$-$C_{14}$ arylene group, a $C_5$-$C_{14}$ hetero arylene group, and a $C_5$-$C_{14}$ arylene group or $C_5$-$C_{14}$ hetero arylene group substituted with at least one of a halogen atom, a cyano group, a hydroxyl group, a $C_1$-$C_{10}$ alkyl group, and a $C_1$-$C_{10}$ alkoxy group:

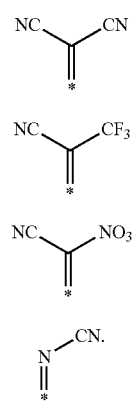

Formula 30A

Formula 30B

Formula 30C

Formula 30D $X_1$ through $X_4$ may each independently be a compound represented by Formula 30A or 30D.

$R_{103}$ may be one of a hydrogen atom; a halogen atom; a cyano group; a $C_1$-$C_{10}$ alkyl group; a $C_1$-$C_{10}$ alkoxy group; a $C_1$-$C_{10}$ alkyl group or $C_1$-$C_{10}$ alkoxy group substituted with at least one of a halogen atom, a cyano group, a phenyl group, a naphthyl group, an anthryl group, a pyridinyl group, a thiophenyl group, and a benzothiophenyl group; or —N($R_{107}$)($R_{108}$), and wherein $R_{107}$ and $R_{108}$ may each independently be a hydrogen atom, a $C_1$-$C_{10}$ alkyl group, a phenyl group, or a biphenyl group.

$R_{101}$ and $R_{102}$ may each independently be a cyano group,

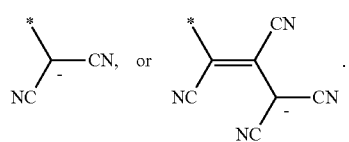

Each of $A_1$ and $A_2$ may be —S—.

$Q_{101}$ and $Q_{102}$ may each independently be an ethylene group; a propylene group; an ethenylene group; a prophenylen group; an ethylene group substituted with at least one of a halogen atom, a cyano group, and a hydroxyl group; a propylene group substituted with at least one of a halogen atom, a cyano group, and a hydroxyl group; an ethenylene group substituted with at least one of a halogen atom, a cyano group, and a hydroxyl group; or a prophenylen group substituted with at least one of a halogen atom, a cyano group, and a hydroxyl group.

$T_1$ and $T_2$ may each independently be benzene; naphthalene; anthracene; thiophene; thiadiazole; oxadiazole; or a benzene, naphthalene, anthracene, thiophene, thiadiazole, or oxadiazole substituted with at least one of a halogen atom, a cyano group, a $C_1$-$C_{10}$ alkyl group, and a $C_1$-$C_{10}$ alkoxy group.

p may be 1.

q may be 0, 1, or 2.

$L_{101}$ may be one of a thiophenylene group; a benzothiophenylene group; a thiophenylene group substituted with at least one of a halogen atom, a cyano group, and a $C_1$-$C_{10}$ alkyl group; and a benzothiophenylene group substituted with at least one of a halogen atom, a cyano group, and a $C_1$-$C_{10}$ alkyl group.

The cyano group-containing compound may be a compound represented by any one of Formulae 1A through 20B below:

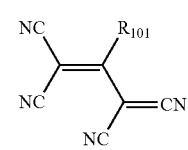

Formula 1A

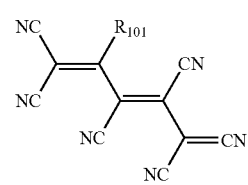

Formula 1B

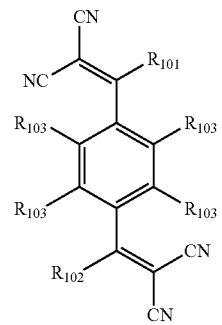

Formula 2A

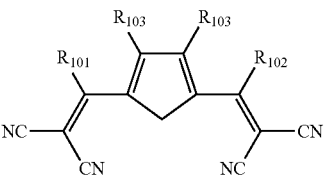

Formula 2B

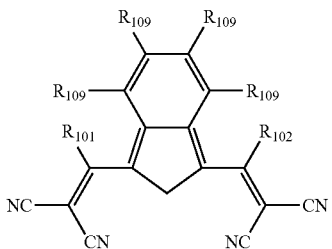

Formula 2C

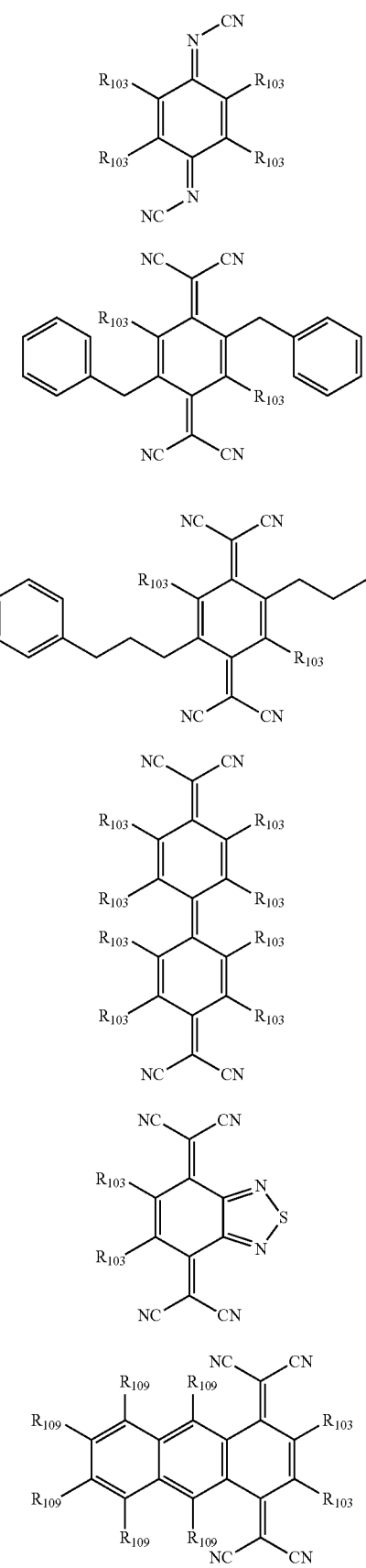
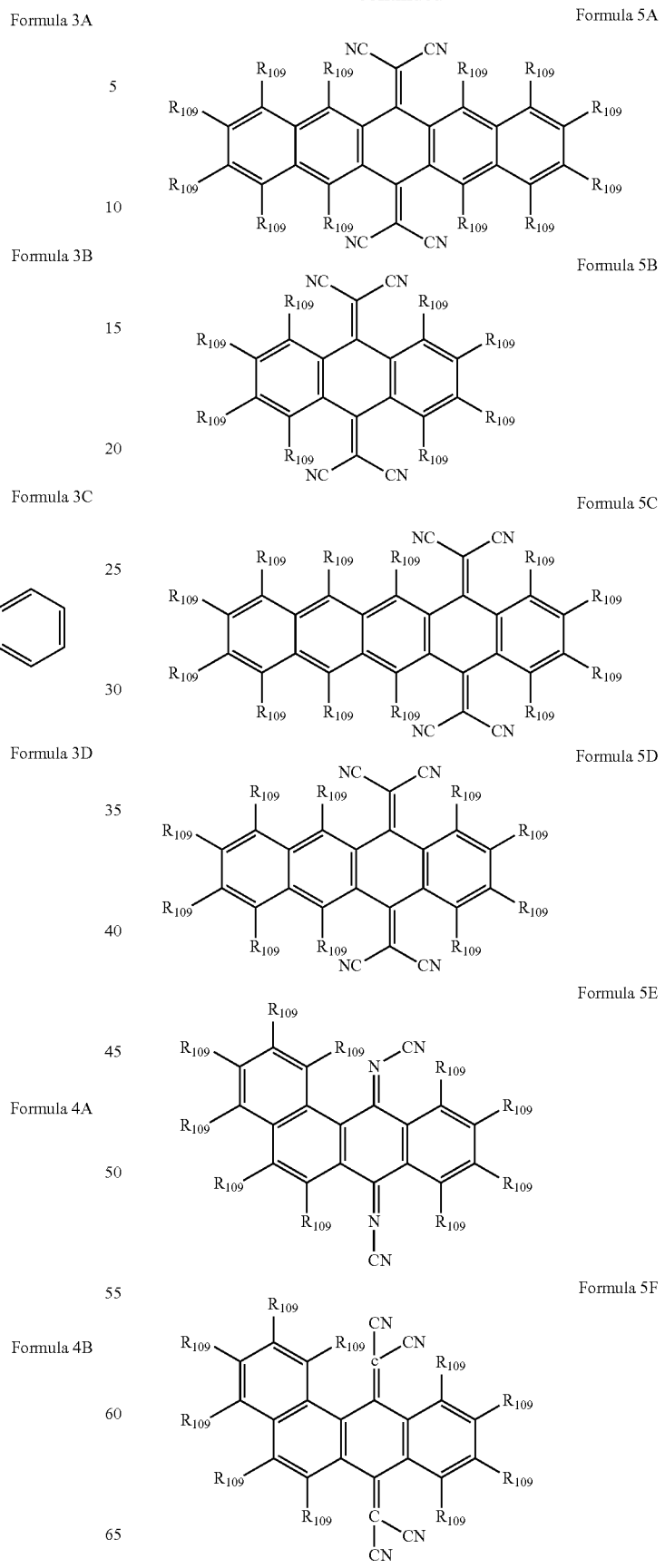

Formula 5G
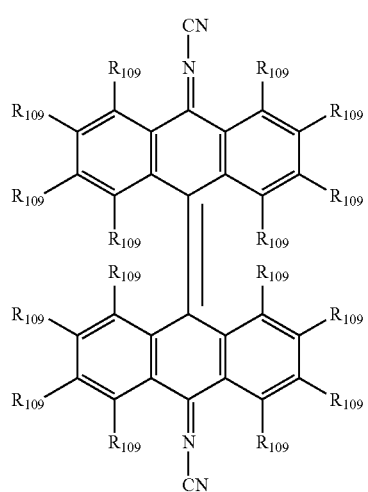
Formula 5H
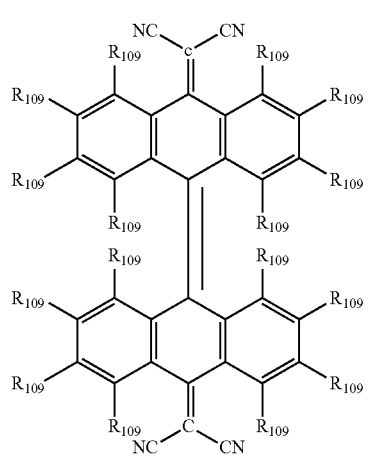
Formula 5I
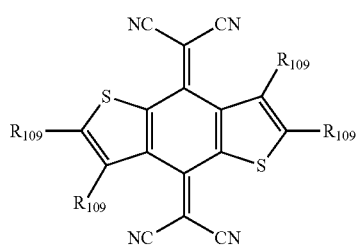
Formula 5J
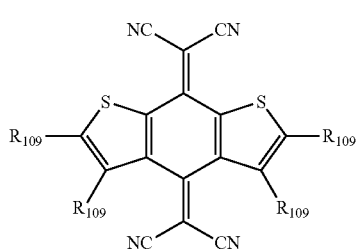
Formula 5K
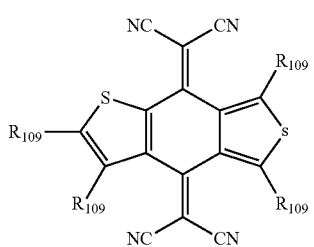
Formula 5L
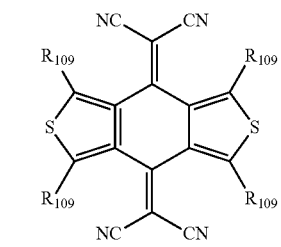
Formula 5M
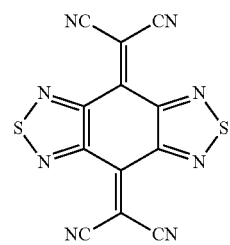
Formula 9A
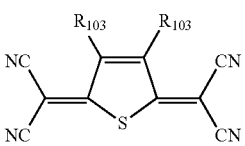
Formula 10A
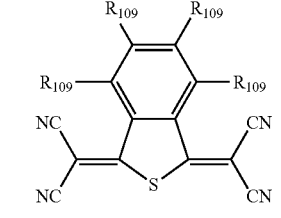
Formula 11A
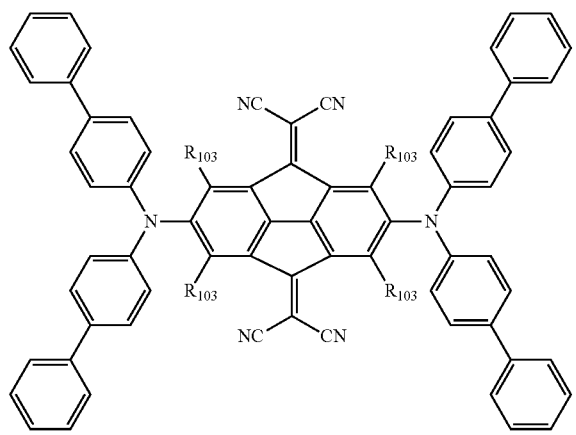

-continued

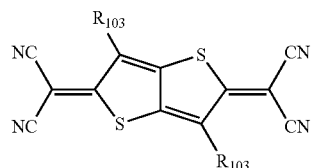
Formula 12A

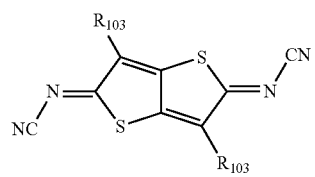
Formula 12B

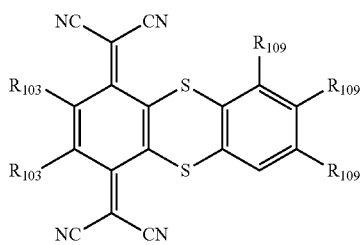
Formula 19A

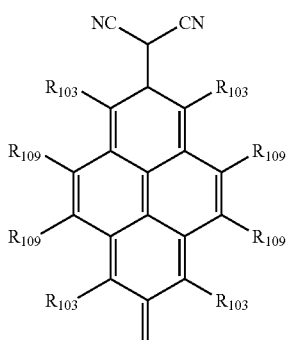
Formula 20A

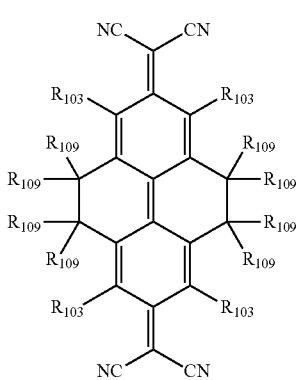
Formula 20B where $R_{103}$ and $R_{109}$ may each independently be a hydrogen atom, —F, a cyano group, a methyl group, an ethyl group, a propyl group, an ethenyl group, a methoxy group, an ethoxy group, or a propoxy group.

The first layer may further include a hole transporting compound.

The hole transporting compound may include a compound represented by Formula 41 or 42 below:

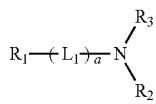
Formula 41

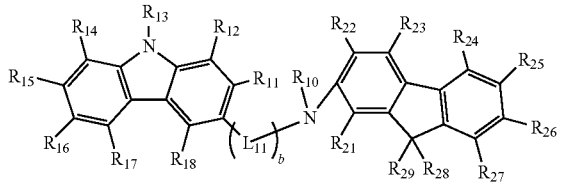
Formula 42 wherein $R_{10}$ may be represented by $-(Ar_1)_n-Ar_2$;
$R_{16}$ may be represented by $-(Ar_{11})_m-Ar_{12}$;
$Ar_1$, $Ar_{11}$, $L_1$, and $L_{11}$ may each independently be a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, or a group represented by —N($Q_1$)-;
n, m, a, and b may each independently be an integer from 0 to 10;
$R_1$ through $R_3$, $R_{11}$ through $R_{15}$, $R_{17}$, $R_{18}$, $R_{21}$ through $R_{29}$, $Ar_2$, $Ar_{12}$ and $Q_1$ may each independently be a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a $C_4$-$C_{30}$ heteroaryl group, or a group represented by —N($Q_2$)($Q_3$); and
$Q_2$ and $Q_3$ may each independently be a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, or a substituted or unsubstituted $C_4$-$C_{30}$heteroaryl group,
wherein n groups of $Ar_1$ in $-(Ar_1)_n-$ may be identical to or different from each other, m groups of $Ar_{11}$ in $-(Ar_{11})_m-$ may be identical to or different from each other, a groups of $L_1$ in -$(L_1)_a-$ may be identical to or different from each other, and b groups of $L_{11}$ in -$(L_{11})_b$- may be identical to or different from each other.

$Ar_1$ and $Ar_{11}$ may each independently be a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —N($Q_1$)-; or a $C_1$-$C_{10}$ alkylene group, phenylene group, naphthylene group, anthrylene group, fluorenylene group, carbazolylene group, pyrazolylene group, pyridinylene group, or triazinylene group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group, and wherein $Q_1$ may be one of a hydrogen atom; a $C_1$-$C_{10}$ alkyl group; a $C_1$-$C_{10}$ alkoxy group; a phenyl group; a naphthyl group; a carbazolyl group; a fluorenyl group; a $C_1$-$C_{10}$ alkyl group, $C_1$-$C_{10}$ alkoxy group, phenyl group, naphthyl group, carbazolyl group, or pyrenyl group substituted with at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and a fluorenyl group; or —N($Q_2$)($Q_3$).

$Ar_2$ and $Ar_{12}$ may each independently be a hydrogen atom; a $C_1$-$C_{10}$ alkyl group; a phenyl group; a naphthyl group; a carbazolyl group; a fluorenyl group; a pyrenyl group; a $C_1$-$C_{10}$ alkyl group, $C_1$-$C_{10}$ alkoxy group, phenyl group, naphthyl group, carbazolyl group, fluorenyl group, or pyrenyl group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group; or —N($Q_2$)($Q_3$), and wherein $Q_2$ and $Q_3$ may each independently be a hydrogen atom, methyl, ethyl, phenyl, methylphenyl, biphenyl, naphthyl, or methylnaphthyl.

n and m may each independently be 0, 1, 2, 3, 4, 5, or 6.

The cyano group-containing compound in the first layer may be included in an amount of about 0.1 to about 20 parts by weight, based on 100 parts by weight of the first layer.

The first layer may have a thickness of about 10 Å to about 2,100 Å.

A distance between the first layer and the emission layer may be about 50 Å or greater.

The organic light-emitting device may further include at least one of a hole injection layer and a hole transport layer between the first layer and the emission layer.

The Al-based reflective layer may include an $Al_x$Ni phase and x may be about 2.5 to about 3.5.

The $Al_x$Ni phase, in which x is about 2.5 to about 3.5, may contact the transparent conductive layer.

x may be 3.

The organic light-emitting device may further include a nickel (Ni)-rich oxide layer on a surface of the Al-based reflective layer facing the transparent conductive layer.

The nickel (Ni) in the Al-based reflective layer may be included in an amount of about 0.6 wt % to about 5 wt %.

The first element may include lanthanum (La).

The first element in the Al-based reflective layer may be included in an amount of about 0.1 wt % to about 3 wt %.

The transparent conductive layer may include indium tin oxide (ITO) or tin oxide ($SnO_2$).

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
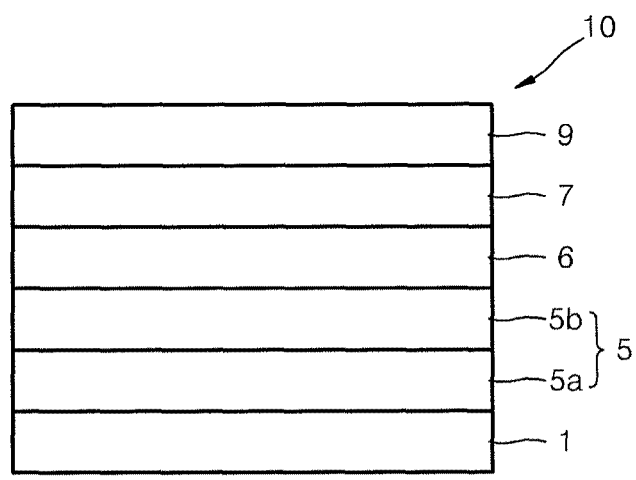
FIG. 1 illustrates a cross-sectional view of a structure of an organic light-emitting device (OLED) according to an embodiment.

Korean Patent Application No. 10-2009-0096822, filed on Oct. 12, 2009, in the Korean Intellectual Property Office, and entitled: "Organic Light-Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a schematic sectional view of an organic light-emitting device (OLED) 10 according to an embodiment. Referring to FIG. 1, the OLED 10 according to the present embodiment may include a substrate 1, a first electrode 5, a first layer 6 containing a cyano-group containing compound, an organic layer 7, and a second electrode 9, which may be sequentially stacked in this order. The first electrode 5 may include an aluminum (Al)-based reflective layer 5a and a transparent conductive layer 5b sequentially stacked on the substrate. The Al-based reflective layer 5a may include, e.g., a first element and nickel (Ni).

The substrate 1, which may be any suitable substrate that is used for organic light emitting devices, may be, e.g., a glass substrate or a transparent plastic substrate with excellent mechanical strength, thermal stability, transparency, surface smoothness, ease of handling, and water-repellent properties.

The first element in the Al-based reflective layer 5a may include at least one of, e.g., lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The Al-based reflective layer 5a may have a high reflectance, and thus may improve luminescent efficiency of the OLED. In addition, the Al-based reflective layer 5a may have high thermal stability due to properties of Al. Thus, the Al-based reflective layer 5a may have excellent durability even when exposed to a high-temperature manufacturing process. In addition, the Al-based reflective layer 5a may have excellent adhesive characteristics with respect to an organic layer or an inorganic layer adjacent thereto.

Therefore, the Al-based reflective layer and the transparent ITO conductive layer may be substantially not separated in a cathode junction region.

The Al-based reflective layer 5a and the transparent conductive layer 5b may contact each other. However, undesirable galvanic corrosion caused due to a potential difference between the Al-based reflective layer 5a and the transparent conductive layer 5b may substantially not occur.

Galvanic corrosion may occur due to a potential difference between two different metals adjacent to each other, thereby causing current to flow and electricity to be generated. One of such two different metals electrically in contact with each other having a relatively greater activity (lower potential) due to their different work functions at an interface thereof may function as a cathode; and the other one having a relatively lower activity (greater potential) may function as an anode. When the two metals are exposed to a corrosive solution, both the metals may be corroded due to the potential difference thereof. This is referred to as galvanic corrosion. The cathode having a greater activity may be corroded faster than when exclusively used; and the anode having a lower activity may be corroded slower than when exclusively used. As such galvanic corrosion spreads along the interface of the two electrode layers formed of different metals, contact resistance between the two electrodes may be abruptly increased. Thus, the contact resistance may be very unstably distributed. Accordingly, when an OLED including two such electrode layers is operated, pixels of the OLED may display colors with inconsistent luminance. Due to this non-uniform luminance, image quality may be significantly lowered. As such, galvanic corrosion may be a quality deterioration factor in OLEDs.

However, since the Al-based reflective layer 5a includes the first element, which will be described below in detail, such galvanic corrosion may substantially not occur between the Al-based reflective layer 5a and the transparent conductive layer 5b. Thus, the OLED according to the present embodiment may be of excellent quality.

The Al-based reflective layer 5a may include, e.g., nickel (Ni). Thus, the Al-based reflective layer 5a may include an $Al_xNi$ phase wherein x is about 2.5 to about 3.5.

Figure 2A:
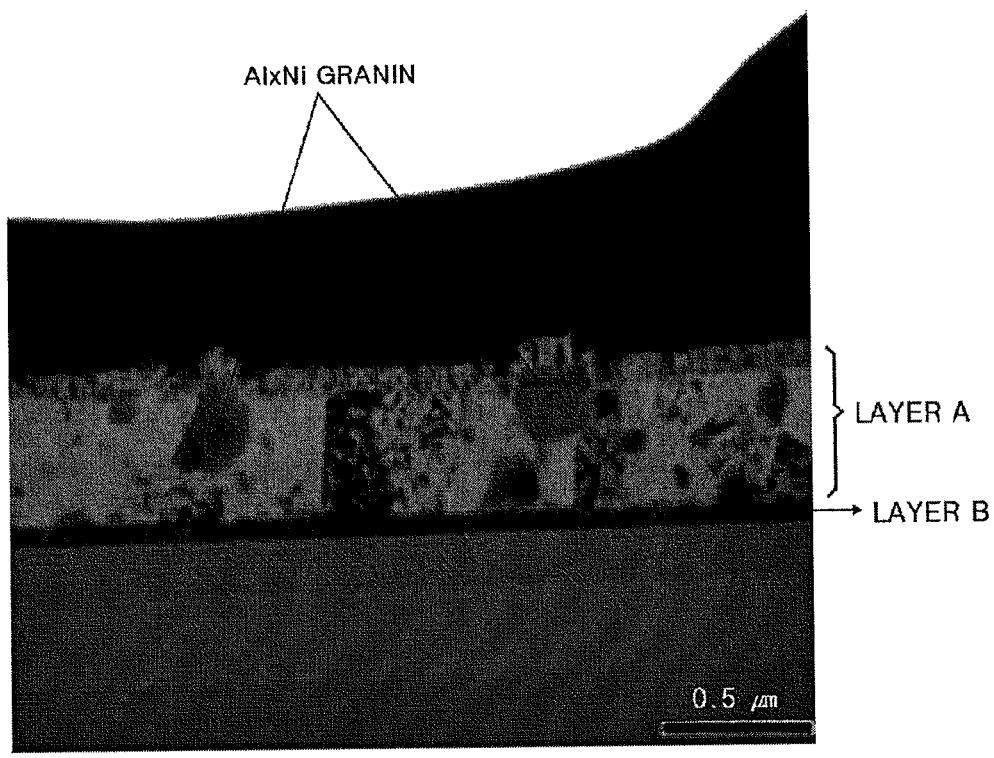
FIG. 2A illustrates a transmission electron microscopic (TEM) image of a cross-section of an aluminum (Al)-based reflective layer according to an embodiment.
Figure 2B:
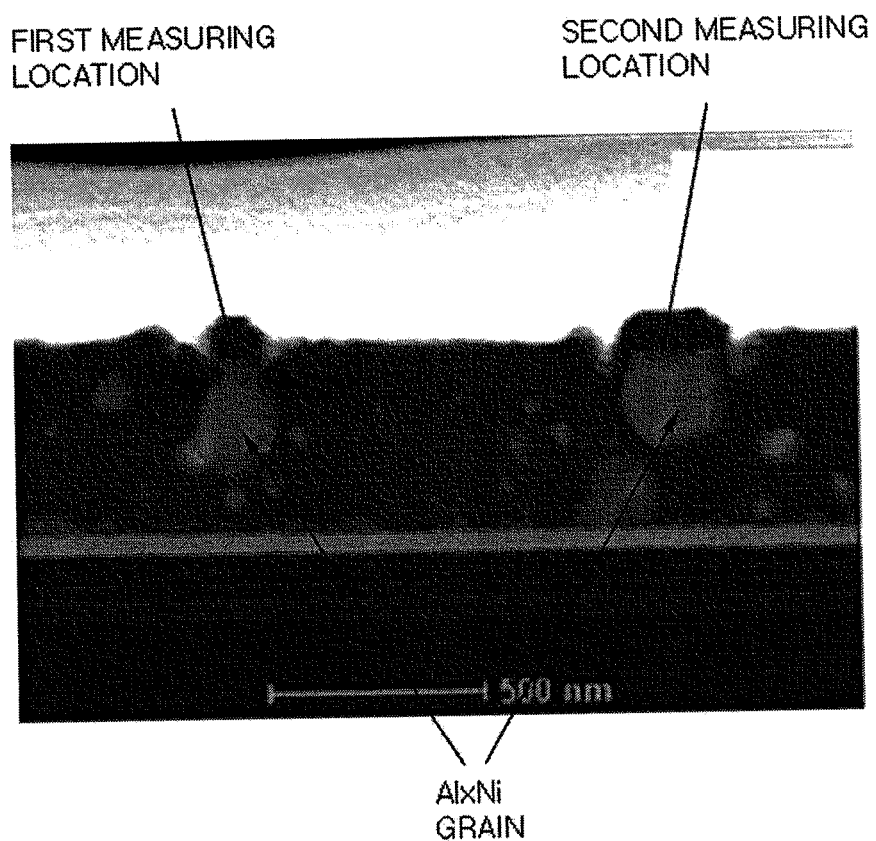
FIG. 2B illustrates a scanning transmission electrode microscope (STEM)-high angle annular dark-field image of the aluminum (Al)-based reflective film shown in FIG. 2A.
Figure 2C:
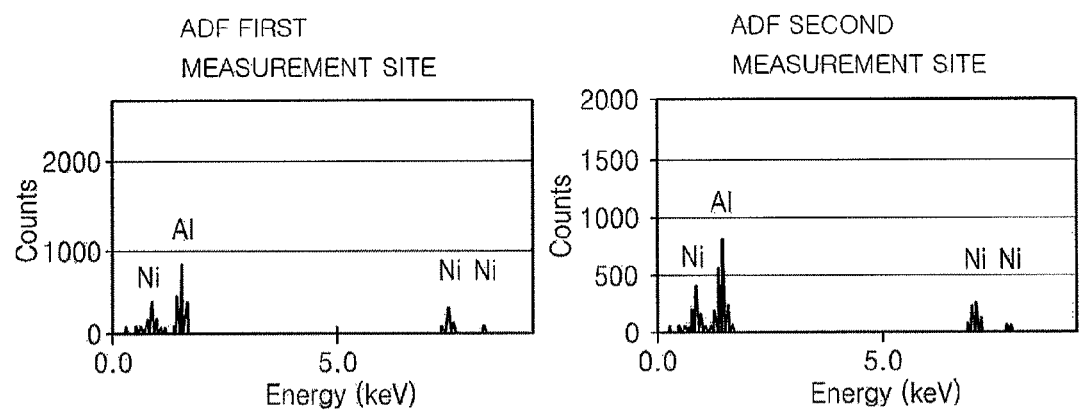
FIG. 2C illustrates a result of energy dispersive X-ray spectroscopy on abnormally grown crystals in FIG. 2A.

FIG. 2A illustrates a transmission electron microscopic (TEM) image of a cross-section of an Al-based reflective layer (layer A) formed on a titanium (Ti) layer (layer B), wherein the Al-based reflective layer includes 2 wt % of nickel (Ni) and 0.35 wt % of lanthanum (La). FIG. 2B illustrates a scanning transmission electrode microscope (STEM)-high angle annular dark-field image of the aluminum (Al)-based reflective film shown in FIG. 2A. FIG. 2C illustrates a result of semi-quantitative energy dispersive X-ray spectroscopy (EDS) on abnormally grown crystals (at first and second measurement sites) appearing in gray in FIG. 2A. As illustrated in FIG. 2C, the abnormally grown crystals in FIG. 2A includes Al and Ni in a ratio of Al(K):Ni(K)=73:27 (in atom %). Thus, the Al-based reflective layer presumably includes an $Al_xNi$ phase wherein x is about 3.

The $Al_xNi$ phase, wherein x is about 2.5 to about 3.5, may contact the transparent conductive layer 5b.

In addition, a Ni-rich oxide layer may be further disposed on a surface of the Al-based reflective layer 5a facing the transparent conductive layer 5b.

Figure 3:
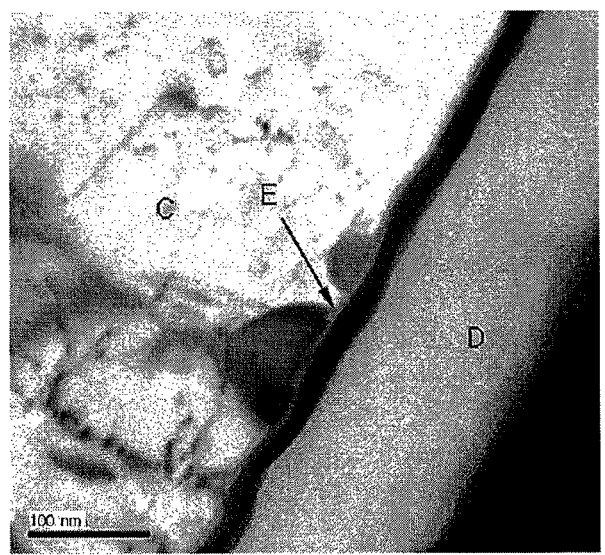
FIG. 3 illustrates a TEM image of a cross-section of a first electrode according to another embodiment.

FIG. 3 illustrates a TEM image of a cross-section of a structure including an Al-based reflective layer (region C) and a transparent ITO conductive layer (region D) sequentially formed on a TFT substrate, wherein the Al-based reflective layer includes 2 wt % of nickel (Ni) and 0.35 wt % of lanthanum (La). In FIG. 3, a linear region, denoted by "E", between the Al-based reflective layer and the transparent ITO conductive layer, corresponds to a Ni-rich oxide layer having a thickness of about 7 nm to about 8 nm.

Due to the $Al_xNi$ phase, wherein x is about 2.5 to about 3.5 and/or the Ni-rich oxide layer described above, ohmic contact may be realized between the Al-based reflective layer 5a and the transparent conductive layer 5b.

The Ni may be included in the Al-based reflective layer 5a in an amount of about 0.6 wt % to about 5 wt %, e.g., about 1 wt % to about 4 wt %. Maintaining the amount of Ni in the Al-based reflective layer 5a at about 0.6 wt % to about 5 wt % may help ensure that the contact resistance between the Al-based reflective layer 5a and the transparent conductive layer 5b is stabilized and reflectivity and durability to chemicals of the Al-based reflective layer 5a is substantially not reduced. In an implementation, the amount of Ni in the Al-based reflective layer 5a may be about 2 wt %. However, the amount of Ni in the Al-based reflective layer 5a is not limited to these amounts.

The Al-based reflective layer 5a may include the first element, in addition to Ni having such a function as described above. The first element may include at least one of, e.g., lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

Since the Al-based reflective layer 5a may include such a first element as listed above, the Al-based reflective layer 5a may have excellent thermal stability and galvanic corrosion may be suppressed. For example, the first element may include lanthanum (La), but is not limited thereto.

The first element may be included in an amount of about 0.1 wt % to about 3 wt %, e.g., about 0.1 wt % to about 1 wt %. Maintaining the amount of the first element at about 0.1 wt % to about 3 wt % may help ensure that neither thermal stability of Al in the Al-based reflective layer 5a nor reflectivity of the Al-based reflective layer 5 are substantially reduced. The amount of the first element is not limited to the above range. For example, the first element may be included in an amount of about 0.3 wt % to about 0.35 wt %, but is not limited thereto.

The Al-based reflective layer 5a may have a thickness of about 50 nm or greater, e.g., about 100 nm to about 500 nm. Maintaining the thickness of the Al-based reflective layer 5a at about 50 nm or greater may help ensure that a decrease in luminescent efficiency caused by passage of light generated in the organic layer 7 through the Al-based reflective layer 5a is substantially prevented.

The transparent conductive layer 5b may be formed of, e.g., a transparent conductive metal oxide. Examples of transparent conductive metal oxides include ITO and tin oxide ($SnO_2$), but are not limited thereto. In an implementation, the transparent conductive layer 5b may be formed of ITO.

The transparent conductive layer 5b may have a thickness of about 5 nm to about 100 nm, e.g., about 7 nm to about 80 nm. Maintaining the thickness of the transparent conductive layer 5b at about 5 nm to about 100 nm may help ensure that a reduction in the reflectivity of the Al-based reflective layer 5a is minimized and that the OLED has excellent efficiency.

The first layer 6 containing a cyano-group containing compound may be formed on the transparent conductive layer 5b. Since the cyano group-containing compound contained in the first layer 6 has two types of one electron reduction state, the cyano group-containing compound may have an extended π-electronic system capable of forming a stable radical (identifiable by, e.g., cyclic voltammetry). Thus, the first layer 6 may lower a hole injection barrier from the first electrode 5 to the organic layer 7. Thus, holes may be easily injected from the first electrode 5 to the organic layer 7. Accordingly, an OLED including the first layer 6 containing a cyano-group containing compound may have excellent driving voltage characteristics and excellent power efficiency characteristics.

The cyano group-containing compound contained in the first layer 6 may include one of the compounds represented by Formulae 1 through 20 below.

Formula 1

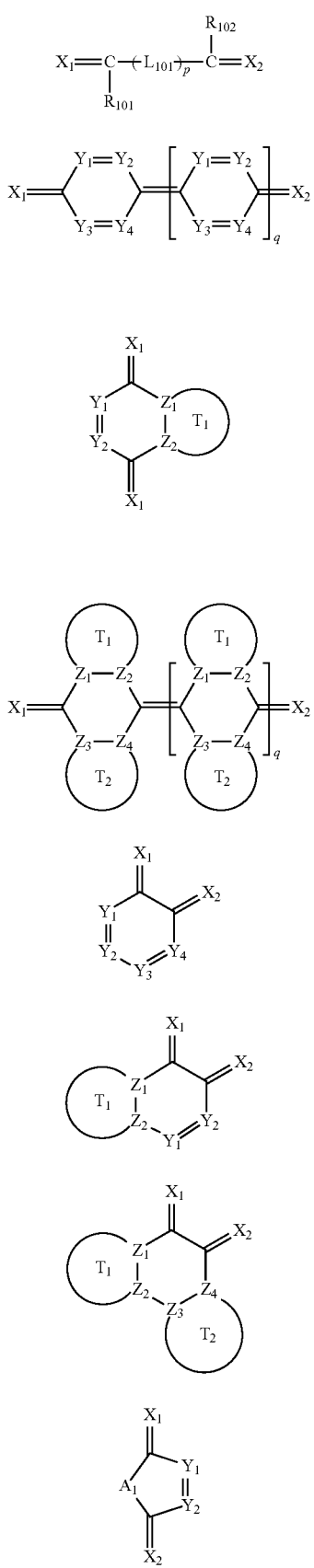
Formula 2
Formula 3
Formula 4
Formula 5
Formula 6
Formula 7
Formula 8
Formula 9
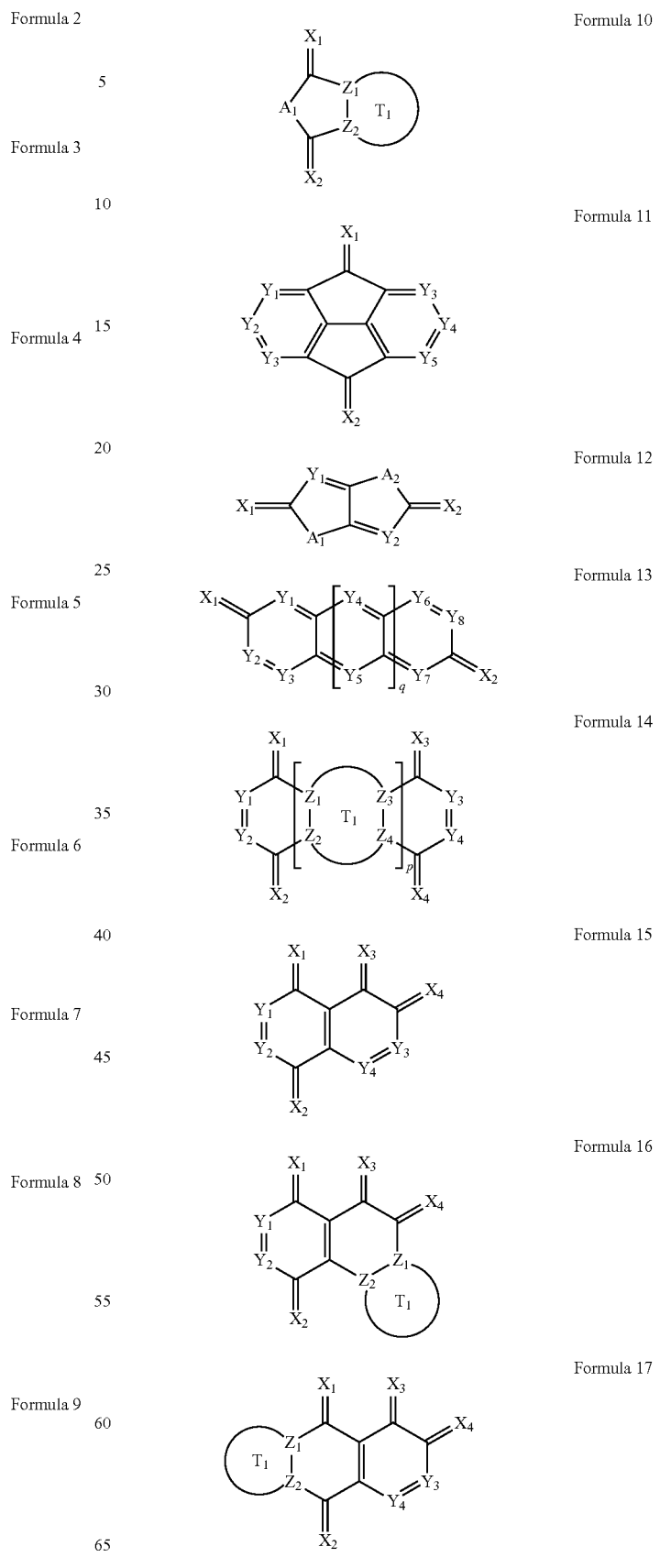
Formula 10
Formula 11
Formula 12
Formula 13
Formula 14
Formula 15
Formula 16
Formula 17

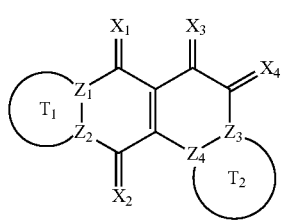

Formula 18

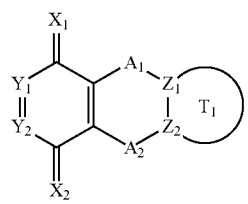

Formula 19

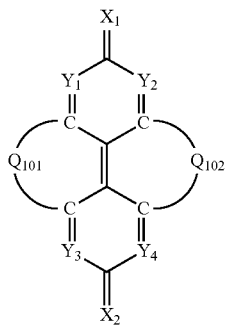

Formula 20

In Formulae 1 through 20, $X_1$ through $X_4$ may each independently be represented by one of Formulae 30A through 30D; $Y_1$ through $Y_8$ may each independently be N or $C(R_{103})$; $Z_1$ through $Z_4$ may each independently be C or N; $A_1$ and $A_2$ may each independently be —O—, —S—, —N($R_{104}$), or —C($R_{105}$)($R_{106}$)—; $Q_{101}$ and $Q_{102}$ may each independently be a $C_2$-$C_{10}$ alkylene group, a $C_2$-$C_{10}$ alkenylene group, or a $C_2$-$C_{10}$ alkylene group or $C_2$-$C_{10}$ alkenylene group substituted with at least one of a halogen atom, a cyano group, a hydroxyl group, a $C_1$-$C_{10}$ alkyl group, and a $C_1$-$C_{10}$ alkoxy group; $T_1$ and $T_2$ may each independently be a $C_5$-$C_{30}$ aromatic ring system, a $C_2$-$C_{30}$ hetero aromatic ring system, or a $C_5$-$C_{30}$ aromatic ring system or $C_2$-$C_{30}$ hetero aromatic ring system substituted with at least one of a halogen atom, a cyano group, a hydroxyl group, a $C_1$-$C_{10}$ alkyl group, and a $C_1$-$C_{10}$ alkoxy group; p may be an integer of 1 through 10; q may be an integer of 0 through 10; $R_{101}$ through $R_{106}$ may each independently be a hydrogen atom, a halogen atom, a cyano group, a hydroxyl group, a $C_1$-$C_{10}$ alkyl group, a $C_1$-$C_{10}$ alkoxy group, a $C_1$-$C_{10}$ alkyl group substituted with at least one of a halogen atom, a cyano group, a hydroxyl group, a $C_5$-$C_{14}$ aryl group, and a $C_2$-$C_{14}$ hetero aryl group, a $C_1$-$C_{10}$ alkoxy group substituted with at least one of a halogen atom, a cyano group, a hydroxyl group, a $C_5$-$C_{14}$ aryl group, and a $C_2$-$C_{14}$ hetero aryl group,

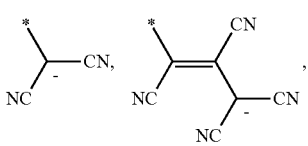 [SMILES: *[C-](C#N)C#N ; */C(C#N)=C(\C#N)[C-](C#N)C#N ; ","]

or —N($R_{107}$)($R_{108}$); $R_{107}$ and $R_{108}$ may each independently be a hydrogen atom, a $C_1$-$C_{10}$ alkyl group, a phenyl group, or a biphenyl group; and $L_{101}$ may be a $C_5$-$C_{14}$ arylene group, a $C_5$-$C_{14}$ hetero arylene group, and a $C_2$-$C_{10}$ alkenylene group, $C_5$-$C_{14}$ arylene group, or $C_5$-$C_{14}$ hetero arylene group substituted with at least one a halogen atom, a cyano group, a hydroxyl group, a $C_1$-$C_{10}$ alkyl group, or a $C_1$-$C_{10}$ alkoxy group:

Formula 30A

NC—*—CN

Formula 30B

NC—*—CF$_3$

Formula 30C

NC—*—NO$_3$

Formula 30D

N=N—CN
|
*

For example, in Formulae 1 through 20, $X_1$ through $X_4$ may be represented by Formula 30A or 30D.

For example, in Formulae 1 through 20, $R_{103}$ may be a hydrogen atom; a halogen atom; a cyano group; a $C_1$-$C_{10}$ alkyl group; a $C_1$-$C_{10}$ alkoxy group; a $C_1$-$C_{10}$ alkyl group or $C_1$-$C_{10}$ alkoxy group substituted with at least one of a halogen atom, a cyano group, a phenyl group, a naphthyl group, an anthryl group, a pyridinyl group, and a thiophenyl group, and a benzothiophenyl group; or —N($R_{107}$)($R_{108}$) where $R_{107}$ and $R_{108}$ are each independently a hydrogen atom, a $C_1$-$C_{10}$ alkyl group, a phenyl group, or a biphenyl group.

For example, $R_{103}$ may be a hydrogen atom, —F, a cyano group, a methyl group, an ethyl group, a propyl group, an ethenyl group, a methoxy group, an ethoxy group, a propoxy group, a methyl group substituted with phenyl, a propyl group substituted with phenyl, or a —N(biphenyl group)(biphenyl group), but is not limited thereto.

In Formulae 1 and 2, $R_{101}$ and $R_{102}$ may each independently be a cyano group, but is not limited thereto.

The compound of Formula 1 may be Compound 20 below, but is not limited thereto:

In Formulae 1 through 20, $A_1$ and $A_2$ may be —S—, but is not limited thereto.

In Formula 20, $Q_{101}$ and $Q_{102}$ may each independently be an ethylene group; a propylene group; an ethenylene group; a prophenylen group; an ethylene group substituted with at least one of a halogen atom, a cyano group, and a hydroxyl group; a propylene group substituted with at least one of a halogen atom, a cyano group, and a hydroxyl group; an ethenylene group substituted with at least one of a halogen atom, a cyano group, and a hydroxyl group; or a prophenylene group substituted with at least one of a halogen atom, a cyano group, and a hydroxyl group. For example, $Q_{101}$ and $Q_{102}$ may each independently be an ethylene group; an ethenylene group; an ethylene group substituted with at least one of —F and a cyano group; and an ethenylene group substituted with at least one of —F and a cyano group, but is not limited thereto.

In Formulae 1 through 20, each of $T_1$ and $T_2$ may be a $C_5$-$C_{30}$ aromatic ring system; a $C_2$-$C_{30}$ hetero aromatic ring system; or a $C_5$-$C_{30}$ aromatic ring system or $C_5$-$C_{30}$ hetero aromatic ring system substituted with at least one of a halogen atom, a cyano group, a hydroxyl group, a $C_1$-$C_{10}$ alkyl group, or a $C_1$-$C_{10}$ alkoxy group, wherein each of these systems includes $Z_1$ and $Z_2$ or $Z_3$ and $Z_4$ as constituent elements. As illustrated in Formulae 1 through 20, each of $T_1$ and $T_2$ may be fused at one or more sites of a backbone of the compounds represented by Formulae 1 through 20.

The $C_5$-$C_{30}$ aromatic ring system refers to a carbocyclic aromatic system that contains at least one aromatic ring and 5 through 30 carbon atoms. In this regard, the term "system" is adopted to represent that $C_5$-$C_{30}$ aromatic ring system also includes a multi-ring structure. When the aromatic ring system includes 2 or more rings, the 2 or more rings may be fused together or connected to each other through a single bond. In an implementation, the aromatic ring system may be a $C_6$-$C_{30}$ aromatic ring system. The $C_2$-$C_{30}$ hetero aromatic ring system refers to a heterocyclic aromatic system that contains at least one aromatic ring and 2 through 30 carbon atoms. For example, the $C_2$-$C_{30}$ hetero aromatic ring system may include at least one hetero atom selected from the group consisting of nitrogen (N), oxygen (O), phosphorous (P), and sulfur (S), and the other ring atoms are carbons (C). If the $C_2$-$C_{30}$ hetero aromatic ring system further includes, in addition to a hetero aromatic ring, at least one of an aromatic ring and a hetero aromatic ring, these rings may be fused to each other. Examples of the $C_5$-$C_{30}$ aromatic ring system include benzene, pentalene, indene, naphthalene, azulene, heptalene, indacene, acenaphthylene, fluorene, phenalene, phenanthrene, anthracene, fluoranthene, triphenylene, pyrene, chrysene, naphthacene, picene, perylene, pentaphene, and hexacene, but are not limited thereto.

For example, the $C_2$-$C_{30}$ hetero aromatic ring system may be pyrrole, pyrazole, imidazole, imidazoline, pyridine, pyrazine, pyrimidine, indole, purine, quinoline, phthalazine, indolizine, naphthyridine, quinazoline, cinnoline, indazole carbazole, phenazine, phenanthridine, pyran, chromene, benzofuran, thiophene, benzothiophene, isothiazole, isoxazole, thiadiazole, or oxadiazole, but is not limited thereto.

For example, in Formulae 1 through 20, $T_1$ and $T_2$ may each independently be benzene; naphthalene; anthracene; thiophene; thiadiazole; oxadiazole; and a benzene, naphthalene, anthracene, thiophene, thiadiazole, or oxadiazole substituted with at least one of a halogen atom, a cyano group, a $C_1$-$C_{10}$ alkyl group, and a $C_1$-$C_{10}$ alkoxy group, but is not limited thereto.

In Formulae 1 through 20, p may be 1, but is not limited thereto. In Formulae 1 through 20, q may be 0, 1, or 2, but is not limited thereto. For example, in Formula 3, q is 0, the compound represented by Formula 3 may be a compound represented by Formula 3A below.

In Formula 2, $L_{101}$ may be a $C_5$-$C_{14}$ arylene group; a $C_4$-$C_{14}$ or $C_5$-$C_{14}$ hetero arylene group; or a $C_5$-$C_{14}$ arylene group or $C_4$-$C_{14}$ or $C_5$-$C_{14}$ hetero arylene group substituted with at least one of a halogen atom, a cyano group, a hydroxyl group, a $C_1$-$C_{10}$ alkyl group, and a $C_1$-$C_{10}$ alkoxy group. For example, $L_{101}$ may be a thiophenylene group; a benzothiophenylene group; a thiophenylene group substituted with at least one of a halogen atom, a cyano group, and a $C_1$-$C_{10}$ alkyl group; and a benzothiophenylene group substituted with at least one of a halogen atom, a cyano group, and a $C_1$-$C_{10}$ alkyl group, but is not limited thereto.

According to an embodiment, the cyano group-containing compound contained in the first layer 6 of the OLED 10 may be represented by one of Formulae 1A through 20B:

Formula 1A

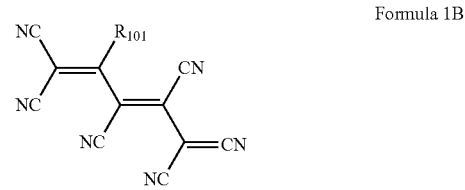

Formula 1B

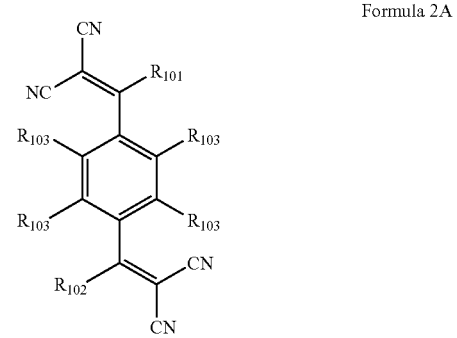

Formula 2A

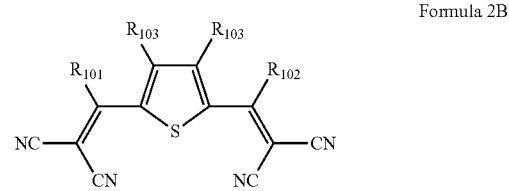

Formula 2B

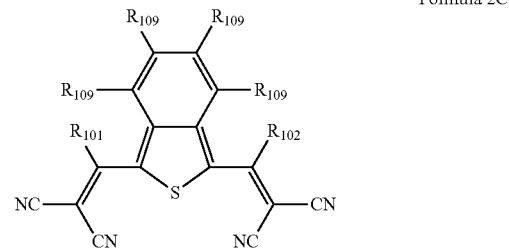

Formula 2C

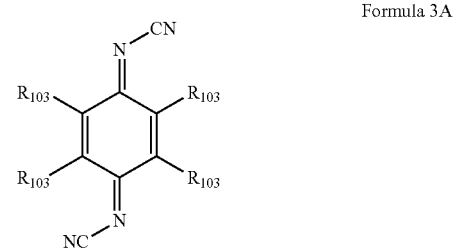

Formula 3A

-continued
Formula 3B
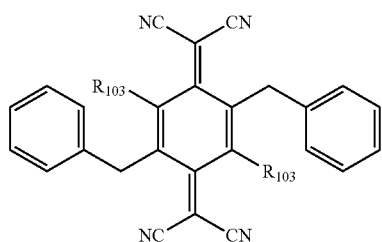
Formula 3C
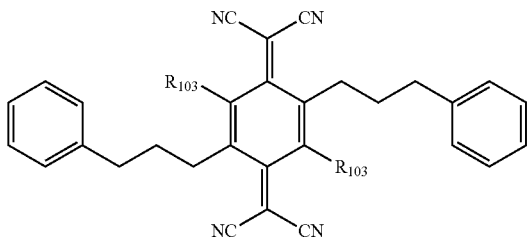
Formula 3D
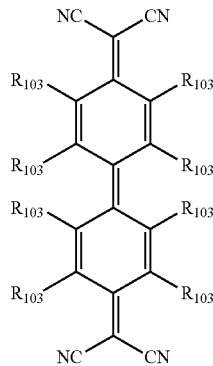
Formula 4A
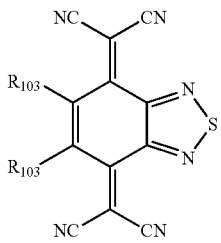
Formula 4B
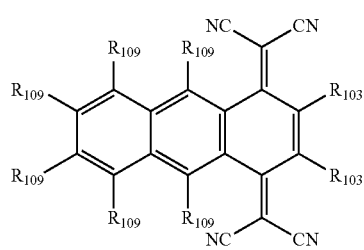
Formula 5A
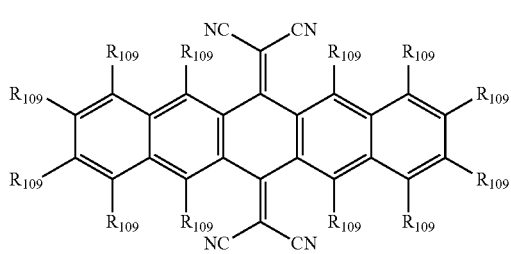
Formula 5B
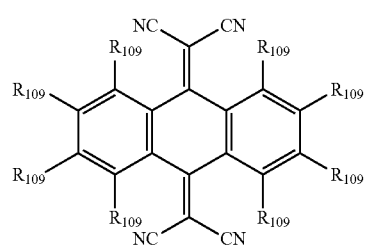
Formula 5C
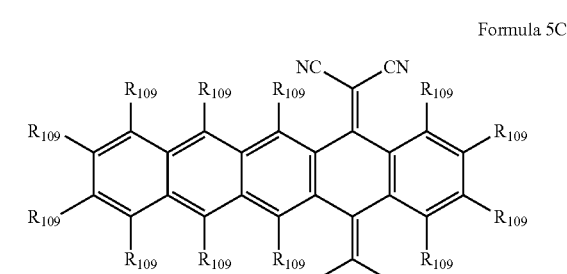
Formula 5D
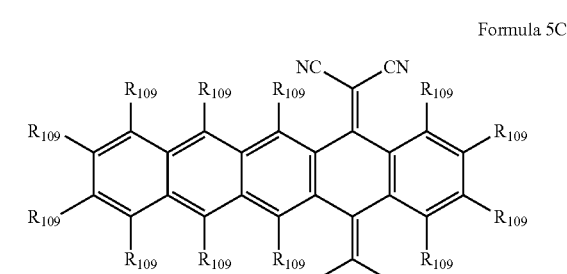
Formula 5E
Formula 5F

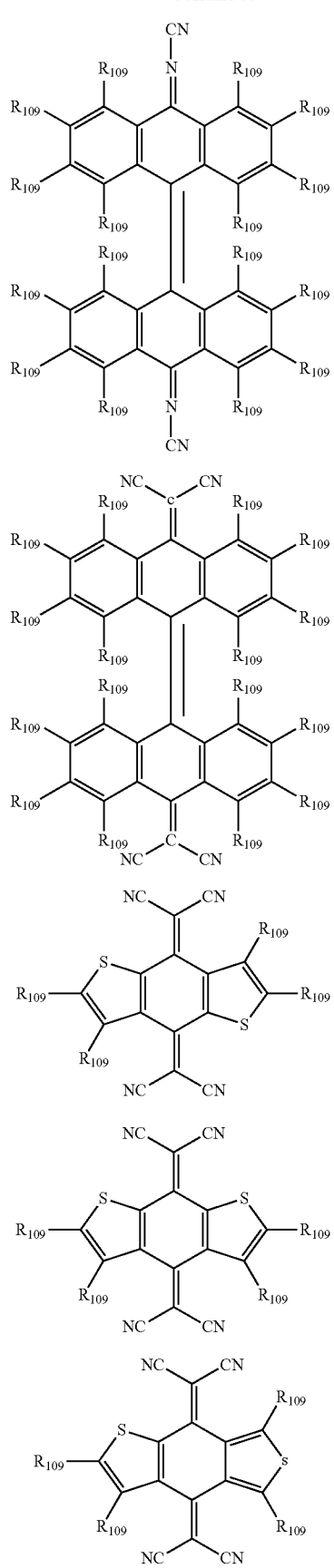
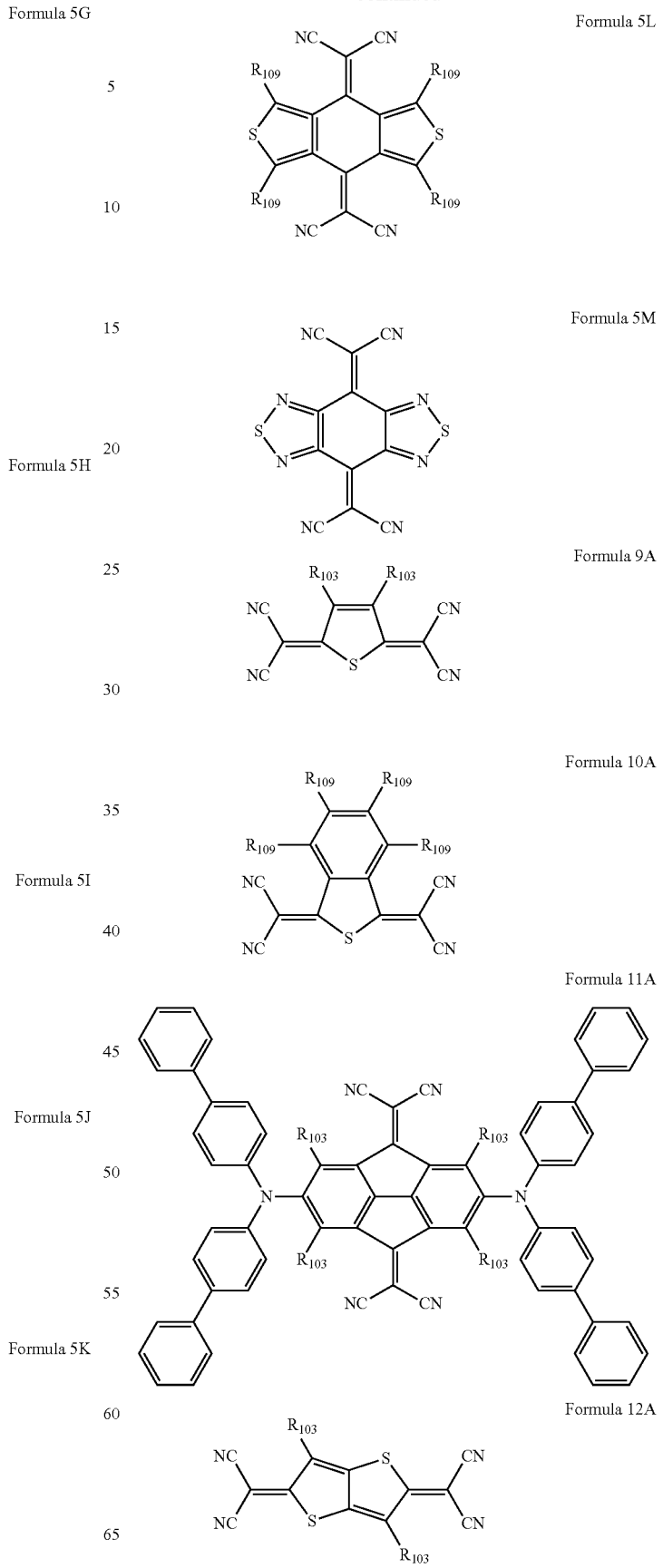

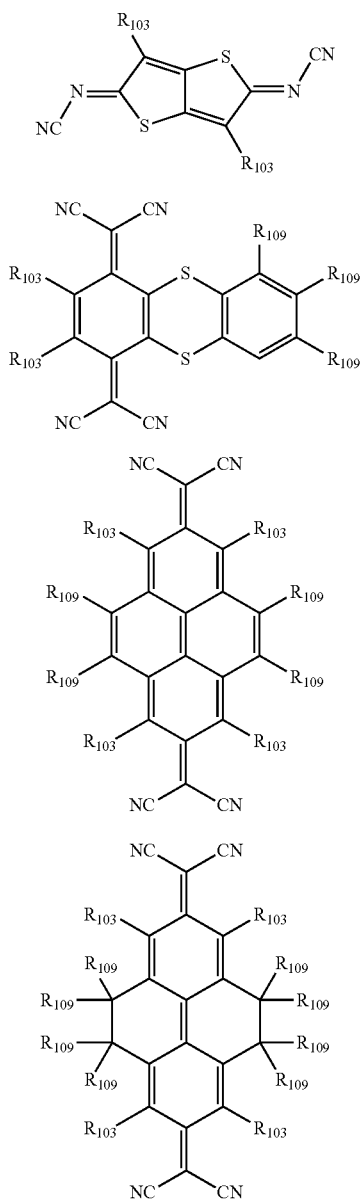

Formula 12B

Formula 19A

Formula 20A

Formula 20B

In Formulae 1A through 20B, $R_{103}$ and $R_{109}$ may each independently be a hydrogen atom, —F, a cyano group, a methyl group, an ethyl group, a propyl group, a methoxy group, an ethoxy group, or a propoxy group.

According to another embodiment, the cyano group-containing compound contained in the first layer 6 of the OLED 10 may be represented by one of Formulae 20A or 20B. In Formulae 20A or 20B, $R_{103}$ and $R_{109}$ may all be —F.

The first layer 6 may further include, in addition to the cyano group-containing compound described above, a hole transporting compound. The cyano group-containing compound may form a charge transfer complex together with the hole transporting compound, thereby leading to an increase in free carrier concentration. Thus, use of the hole transporting compound may contribute to a decrease in an interface resistance between the first electrode 5 and the organic layer 7.

The hole transporting compound may be any suitable hole transporting materials.

In an implementation, the hole transporting compound may be a compound represented by Formula 41 or 42 below.

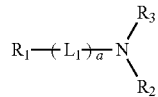

Formula 41

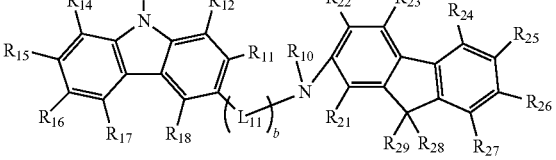

Formula 42

In Formulae 41 and 42, $R_{10}$ may be represented by —$(Ar_1)_n$—$Ar_2$; $R_{16}$ may be represented by —$(Ar_{11})_m$—$Ar_{12}$; $Ar_1, Ar_{11}, L_1$ and $L_{11}$ may each independently be a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, or a group represented by —N($Q_1$)-; n, m, a, and b may each independently be an integer from 0 to 10; $R_1$ through $R_3$, $R_{11}$ through $R_{15}$, $R_{17}$, $R_{13}$, $R_{21}$ through $R_{29}$, $Ar_2$, $Ar_{12}$ and $Q_1$ may each independently be a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a substituted or unsubstituted $C_4$-$C_{30}$ heteroaryl group, or a group represented by —N($Q_2$)($Q_3$); and $Q_2$ and $Q_3$ may each independently be a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, or a substituted or unsubstituted $C_4$-$C_{30}$ heteroaryl group, wherein n groups of $Ar_1$ in —$(Ar_1)_n$ may be identical to or different from each other, m groups of $Ar_{11}$ in —$(Ar_{11})_m$— may be identical to or different from each other, a groups of $L_1$ in -$(L_1)_a$- may be identical to or different from each other, and b groups of $L_{11}$ in -$(L_{11})_b$- may be identical to or different from each other.

Examples of $Ar_1$ in the formula —$(Ar_1)_n$—$Ar_2$— for $R_{10}$ and $Ar_{11}$ in the formula —$(Ar_{11})_m$—$Ar_{12}$— for $R_{16}$ may include a substituted or unsubstituted $C_1$-$C_{10}$ alkylene group, a substituted or unsubstituted $C_2$-$C_{10}$ alkenylene group, a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthracenylene group, a substituted or unsubstituted fluoranthenylene group, a substituted or unsubstituted triphenylenylene group, a substituted or unsubstituted pyrenylenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, a substituted or unsubstituted isoxazolylene group, a substituted or unsubstituted triazinylene group, and a group represented by —N($Q_1$)-, but are limited thereto. In this regard, $Q_1$ may be selected from the group consisting of a hydrogen atom, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted $C_2$-$C_{10}$ alkynyl group, a substituted or unsubstituted $C_1$-$C_{10}$ alkoxy group, a substituted or unsubstituted $C_1$-$C_{10}$ alkylthiol group, a substituted or unsubstituted $C_5$-$C_{14}$ aryl group, a substituted or unsubstituted $C_4$-$C_{14}$ heteroaryl group, and —N($Q_1$)($Q_2$)-, but is not limited thereto.

For example, $Ar_1$ and $Ar_{11}$ may each independently be a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —N($Q_1$)-; or a $C_1$-$C_{10}$ alkylene group, phenylene group, naphthylene group, anthrylene group, fluorenylene group, carbazolylene group, pyrazolylene group, pyridinylene group, or triazinylene group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group. In this regard, $Q_1$ may be a hydrogen atom; a $C_1$-$C_{10}$ alkyl group; a $C_1$-$C_{10}$ alkoxy group; a phenyl group; a naphthyl group; a carbazolyl group; a fluorenyl group; a pyrenyl group; a $C_1$-$C_{10}$ alkyl group, $C_1$-$C_{10}$ alkoxy group, phenyl group, naphthyl group, carbazolyl group, fluorenyl group, or pyrenyl group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and —N($Q_2$)($Q_3$). In this regard, each of Q2 and Q3 may be a methyl group, a phenyl group, a naphthyl group, or an anthryl group.

$Ar_2$ in the formula —($Ar_1$)$_n$—$Ar_2$— and $Ar_{12}$ in the formula —($Ar_{11}$)$_m$—$Ar_{12}$— may be as defined above in connection with $Q_1$.

n in the formula —($Ar_1$)n-$Ar_2$— and m in the formula —($Ar_{11}$)$_m$—$Ar_{12}$— may each independently be an integer in the range from 0 to 10. For example, n and m may each independently be 0, 1, 2, 3, 4 or 5, but are not limited thereto.

n groups of $Ar_1$ in the formula —($Ar_1$)$_n$—$Ar_2$— may be identical to or different from each other. For example, when n is 2, the two groups of $Ar_1$ in —($Ar_1$)$_n$— may be both phenylene groups, or one of the two may be —N($Q_1$)- and the other may be a phenylene group. This interpretation may also be applied to —($Ar_{11}$)$_m$—$Ar_{12}$—.

$R_1$ through $R_3$, $R_{11}$ through $R_{15}$, $R_{17}$, $R_{18}$, and $R_{21}$ through $R_{29}$ in 41 and 42 may be defined as described above in connection with $Q_1$.

For example, $R_{13}$ may be a phenyl group, a naphthyl group, or an anthryl group, but is not limited thereto.

For example, $R_{28}$ and $R_{29}$ may each independently be a hydrogen atom, a methyl group, an ethyl group, a methoxy group, an ethoxy group, a phenyl group, a naphthyl group or an anthryl group, but are not limited thereto.

$L_1$ and $L_2$ in Formulae 41 and 42 may be defined as described above in connection with $Ar_1$ and $Ar_{11}$. For example, $L_1$ and $L_2$ may each independently be a phenylene group, a $C_1$-$C_{10}$ alkylphenylene group, a fluorophenylene group, a carbazolylene group, a triazinylene group, a $C_1$-$C_{10}$ alkyltriazinylene group, a phenyltriazinylene group, $C_1$-$C_{10}$ alkylene group, or a phenylcarbazolylene group, but are not limited thereto.

In Formulae 41 and 42, a and b may each independently be an integer in the range from 0 to 10. For example, a and b may each independently be 0, 1, 2 or 3, but are not limited thereto.

For example, in Formula 42, $Ar_1$ in the formula —($Ar_1$)n-$Ar_2$— for $R_{10}$ and $Ar_{11}$ in the formula —($Ar_{11}$)$_m$—$Ar_{12}$— for $R_{16}$ may each independently be a phenylene group; a carbazolylene group; a fluorenylene group; a methylfluorenylene group; a pyrazolylene group; a phenylpyrazolylene group; —N($Q_1$)-, wherein $Q_1$ is a hydrogen atom, a phenyl group, a fluorenyl group, a dimethylfluorenyl group, a diphenylfluorenyl group, a carbazolyl group, or a phenylcarbazolyl group; a diphenylfluorenylene group; a triazinylene group; a methyltriazinylene group; a phenyltriazinylene group; a tetrafluorophenylene group; an ethylene group; or a methylphenylene group, wherein n and m are each independently 0, 1, 2, 3, 4, 5 or 6, and $Ar_2$ and $Ar_{12}$ are each independently a hydrogen atom, a cyano group, a fluoro group, a phenyl group, a cyanophenyl group, a naphthyl group, an anthryl group, a methyl group, a pyridinyl group, a carbazolyl group, a phenylcarbazolyl group, a fluorenyl group, a dimethylfluorenyl group, and a diphenylfluorenyl group. In Formula 42, $R_{11}$, $R_{12}$, $R_{14}$, $R_{15}$, $R_{17}$, $R_{18}$, $R_{21}$ through $R_{27}$ may be a hydrogen atom; $R_{13}$ may be a phenyl group, a naphthyl group or an anthryl group; $R_{28}$ and $R_{29}$ may each independently be a hydrogen atom, a methyl group, an ethyl group, a methoxy group, an ethoxy group, a phenyl group, a naphthyl group, or an anthryl group; $L_{11}$ may be a phenylene group; and b may be 0 or 1.

For example, in Formula 42, $R_{13}$ may be represented by one of Formulae 101A to 101D.

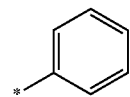

Formula 101A

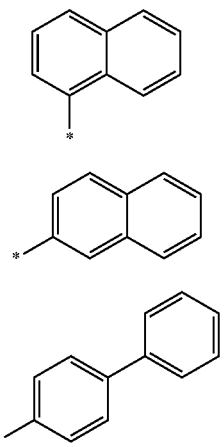

Formula 101B

Formula 101C

Formula 101D

For example, in Formula 42, $L_{11}$ may be a phenylene group and b may be 1. For example, in Formula 42, $R_{10}$ may be represented by one of Formulae 102A to 102G.

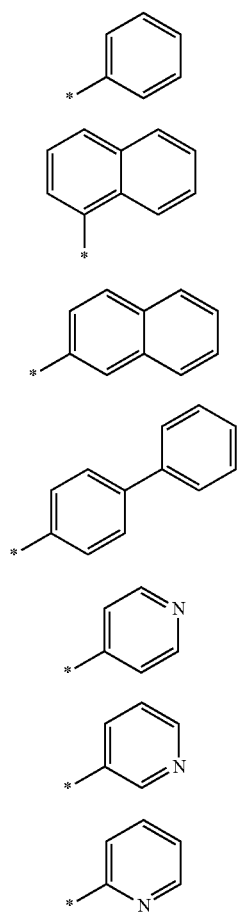

Formula 102A

Formula 102B

Formula 102C

Formula 102D

Formula 102E

Formula 102F

Formula 102G

For example, in Formula 42, $R_{28}$ and $R_{29}$ may each independently be a methyl group or a phenyl group. For example, in Formula 42, $R_{11}$, $R_{12}$, $R_{14}$ to $R_{18}$ and $R_{21}$ to $R_{27}$ may be a hydrogen atom.

For example, in Formula 41, $R_1$, $R_2$, and $R_3$ may each independently be a $C_1$-$C_{10}$ alkyl group; a $C_1$-$C_{10}$ alkoxy group; a phenyl group; a naphthyl group; a carbazolyl group; a fluorenyl group; a pyrenyl group; an anthryl group; a pyrazolyl group; a pyridinyl group; a $C_1$-$C_{10}$ alkyl group, a $C_1$-$C_{10}$ alkoxy group, a phenyl group, a naphthyl group, a carbazolyl group, a fluorenyl group, a pyrenyl group, an anthryl group, a pyrazolyl group or a pyridinyl group substituted with at least one of a halogen atom, a cyano group, a hydroxyl group, a $C_1$-$C_{10}$ alkyl group, a $C_1$-C10 alkoxy group, a phenyl group, a cyanophenyl group, a diphenylamino group, a naphthyl group, a carbazolyl group, a fluorenyl group, a $C_1$-$C_{10}$ alkyfluorenyl group, a di($C_1$-$C_{10}$ alky)fluorenyl group, a phenylfluorenyl group, a di(phenyl)fluorenyl group, and an anthryl group; or —N(Q2)(Q3). In this regard, each of Q2 and Q3 may each independently be a $C_1$-$C_{10}$ alkyl group; a $C_1$-$C_{10}$ alkoxy group; a phenyl group; a naphthyl group; a carbazolyl group; a fluorenyl group; a pyrenyl group; an anthryl group; a pyrazolyl group; a pyridinyl group; or a $C_1$-$C_{10}$ alkyl group, a $C_1$-$C_{10}$ alkoxy group, a phenyl group, a naphthyl group, a carbazolyl group, a fluorenyl group, a pyrenyl group, an anthryl group, a pyrazolyl group or a pyridinyl group substituted with at least one of a halogen atom, a cyano group, a hydroxyl group, a $C_1$-$C_{10}$ alkyl group, a $C_1$-$C_{10}$ alkoxy group, a phenyl group, a cyanophenyl group, a diphenylamino group, a naphthyl group, a carbazolyl group, a fluorenyl group, a $C_1$-$C_{10}$ alkyfluorenyl group, a di($C_1$-$C_{10}$ alky)fluorenyl group, a phenylfluorenyl group, a di(phenyl)fluorenyl group, and an anthryl group.

For example, in Formula 41, $R_1$, $R_2$, and $R_3$ may each independently be one of Formulae 201 to 226 as follows:

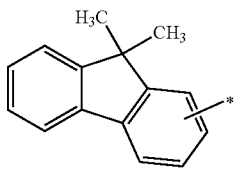

Formula 201

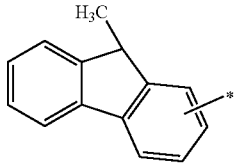

Formula 202

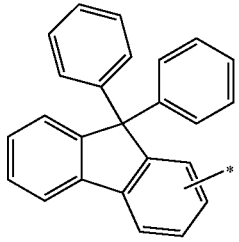

Formula 203

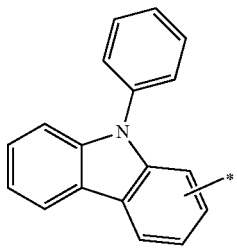

Formula 204

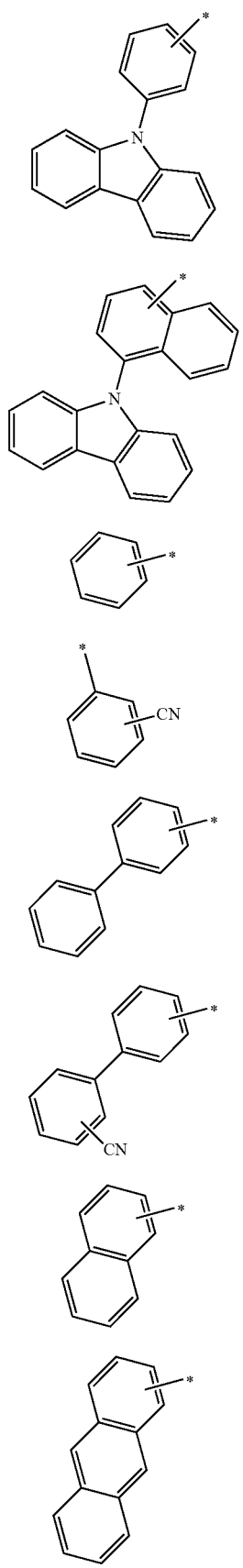
Formula 205
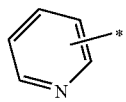
Formula 213
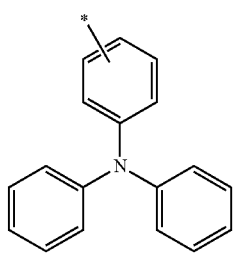
Formula 214
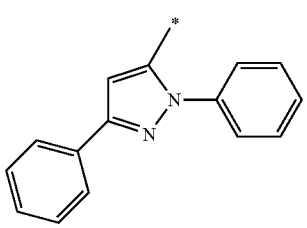
Formula 215
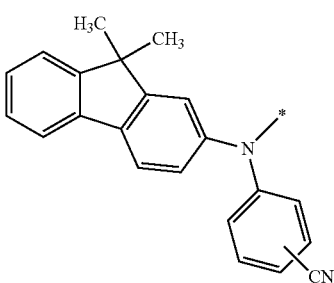
Formula 216
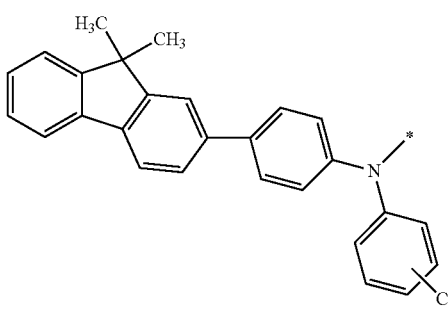
Formula 217
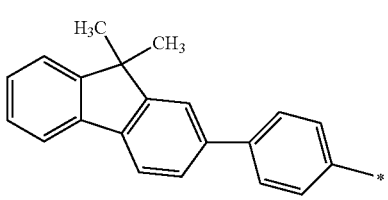
Formula 218
Formula 206
Formula 207
Formula 208
Formula 209
Formula 210
Formula 211
Formula 212

Formula 219
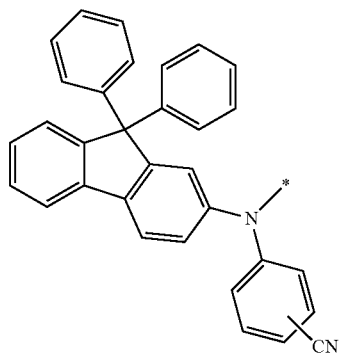
Formula 220
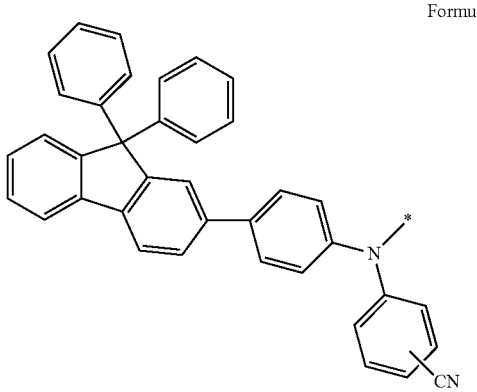
Formula 221
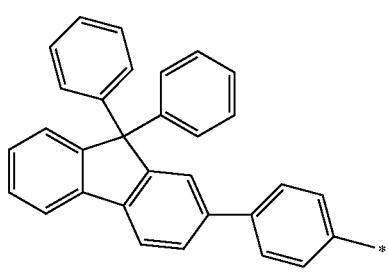
Formula 222
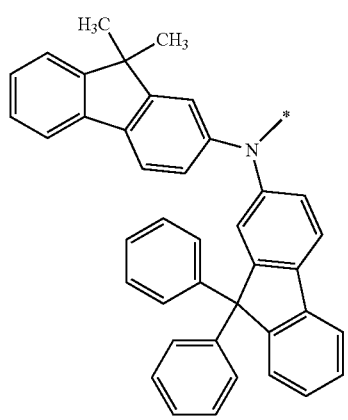
Formula 223
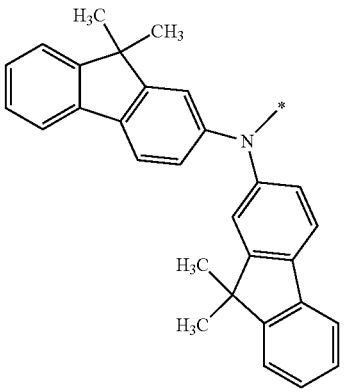
Formula 224
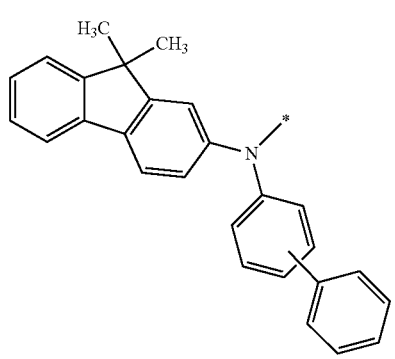
Formula 225
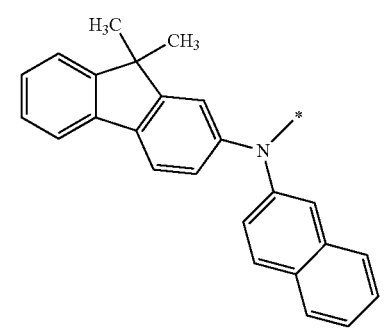
Formula 226
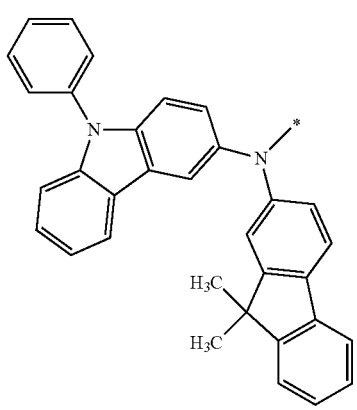
In an implementation, the hole transporting material may be any one of compounds represented by Compounds 1 through 38 below, but is not limited thereto:

37 38
1
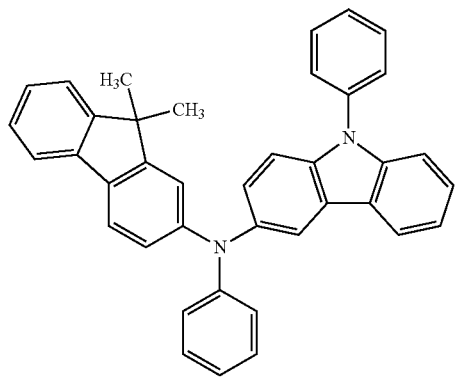
2
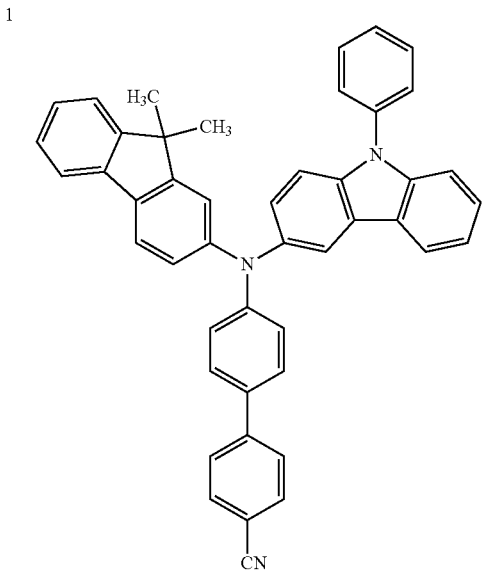
3
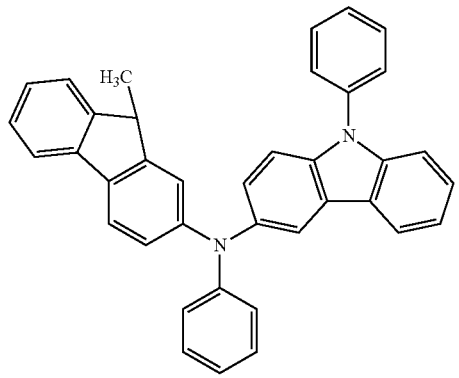
4
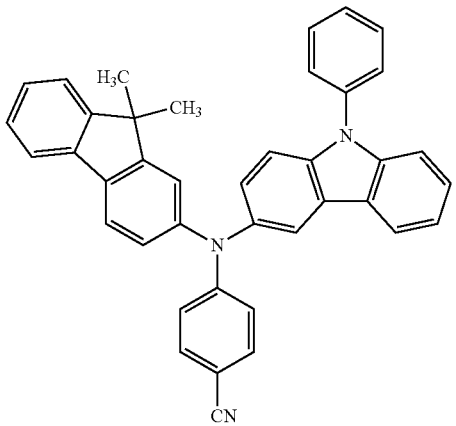
5
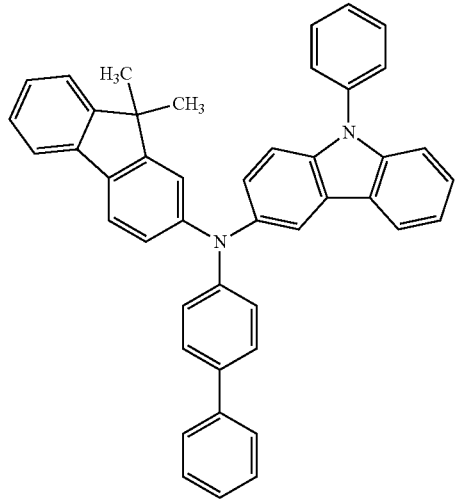
6
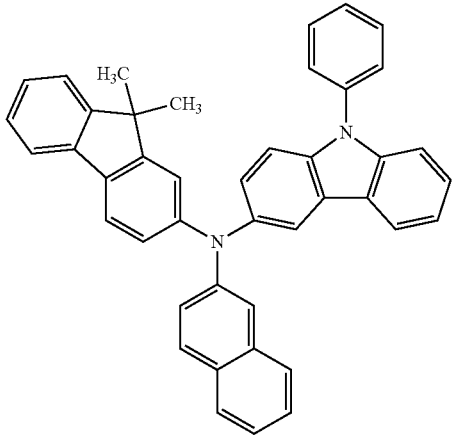

-continued
7
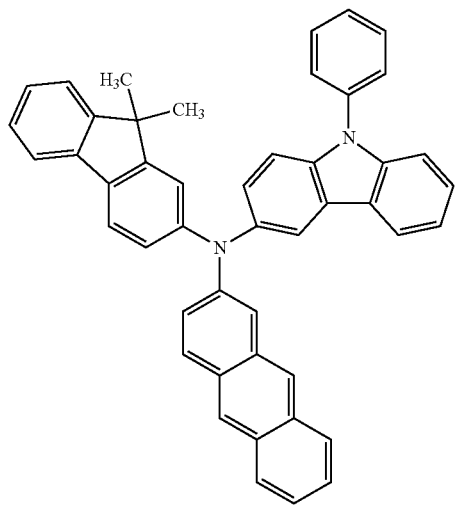
8
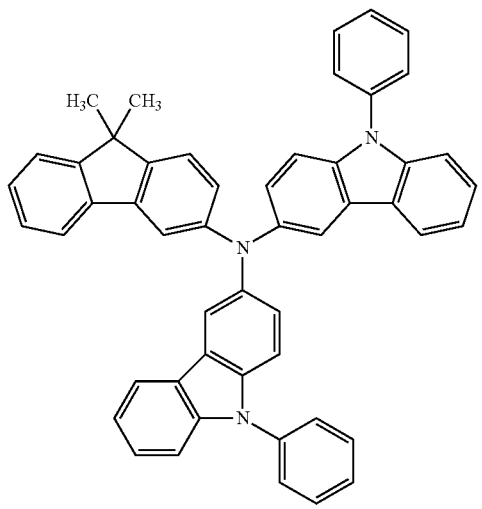
9
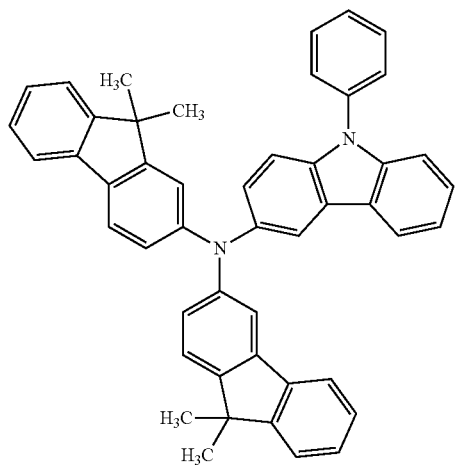
10
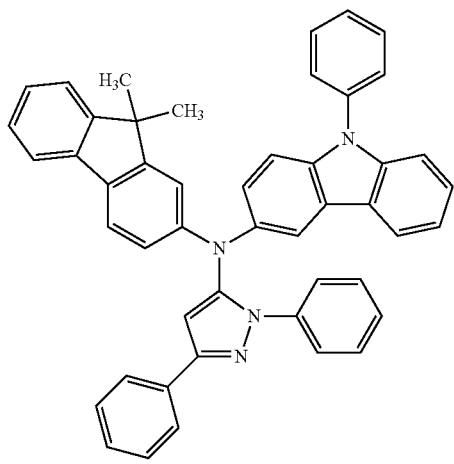
11
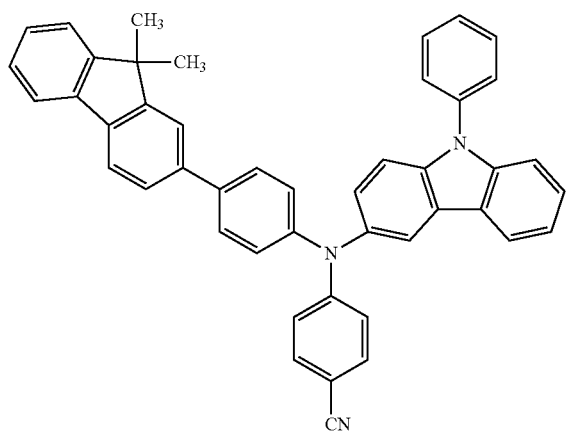
12
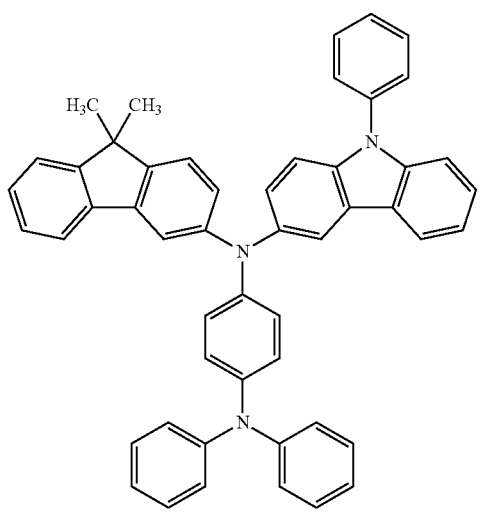

-continued
13
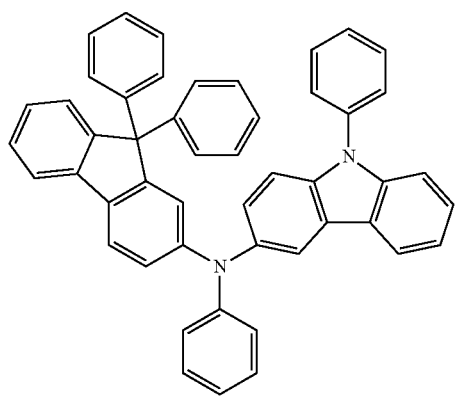
14
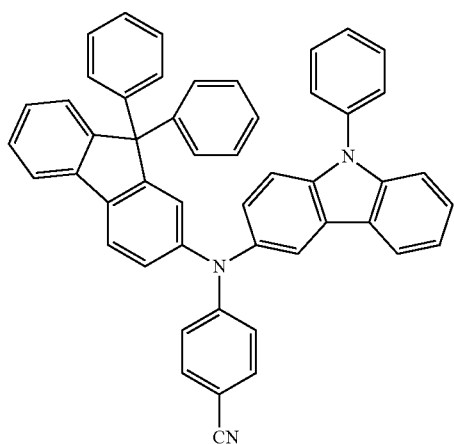
15
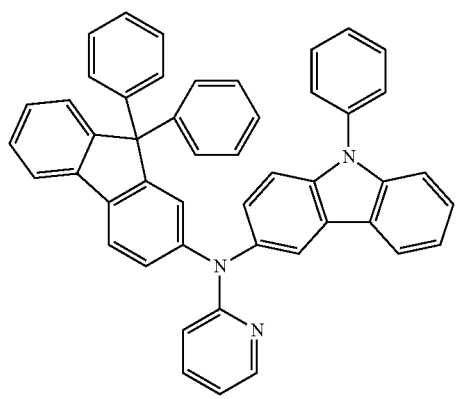
16
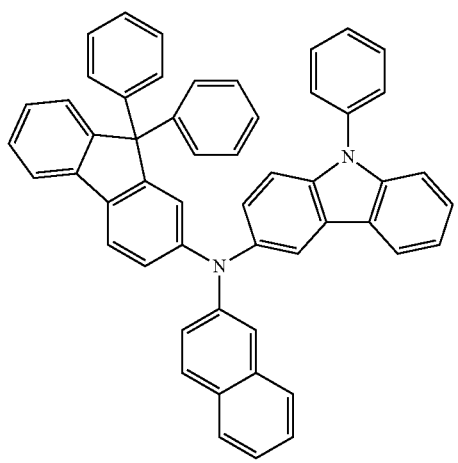
17
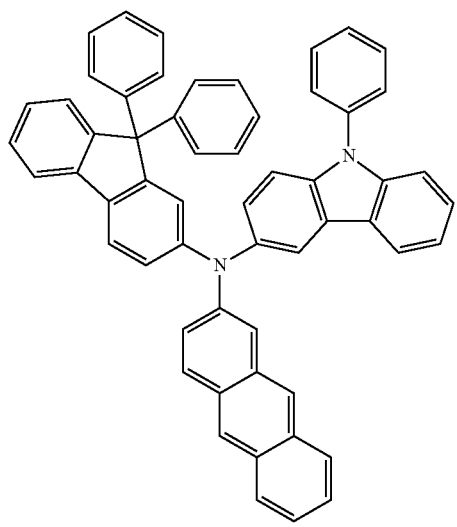
18
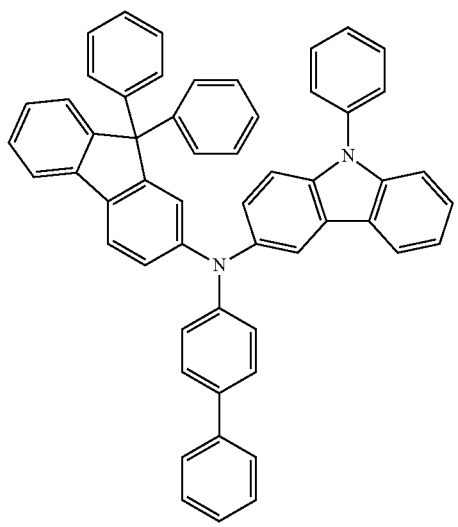

-continued
19
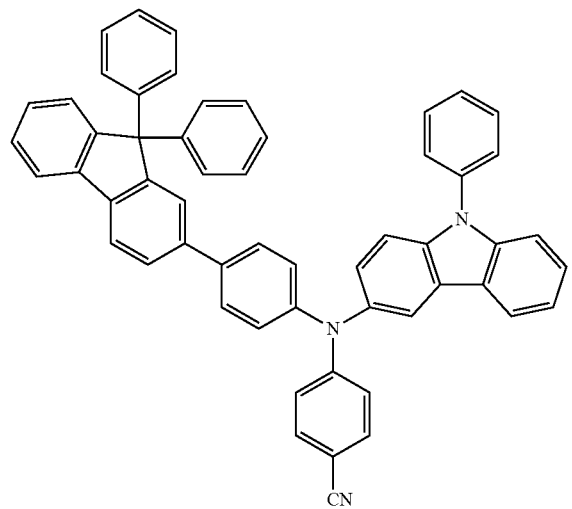
20
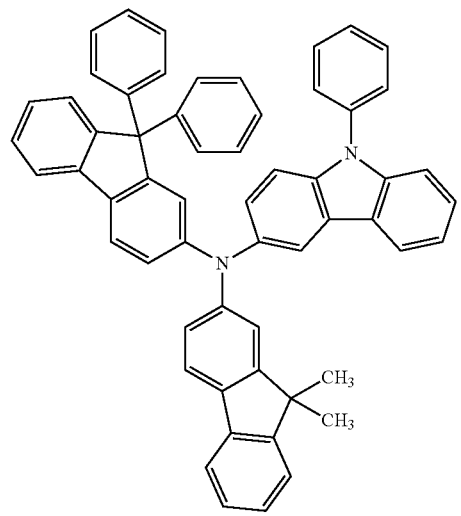
21
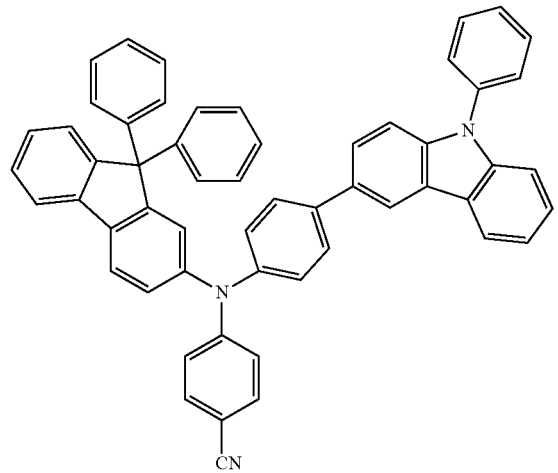
22
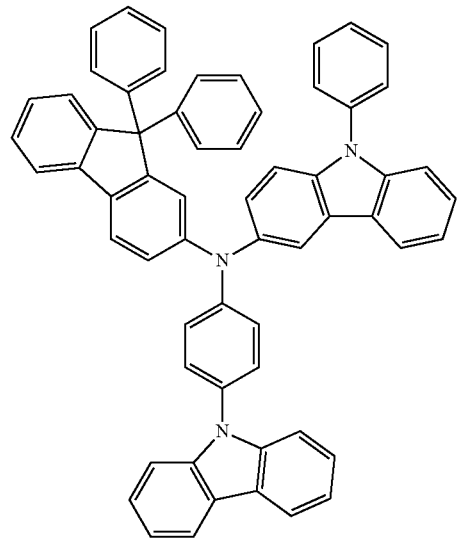

-continued
23
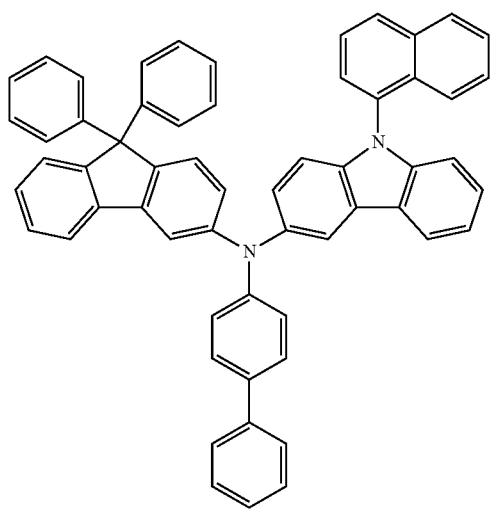
24
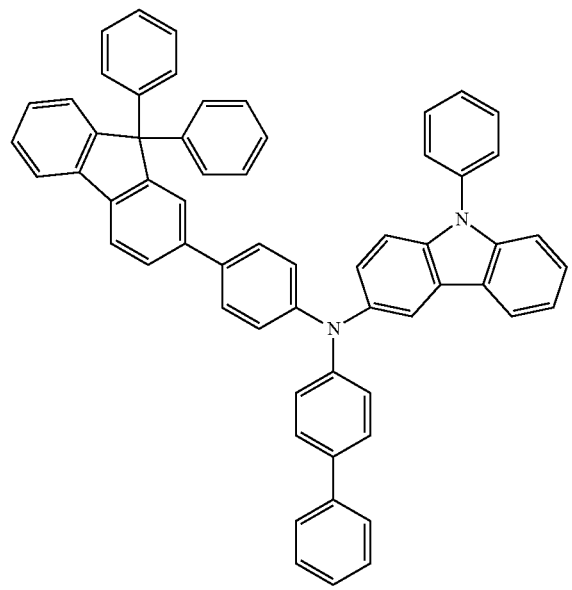
25
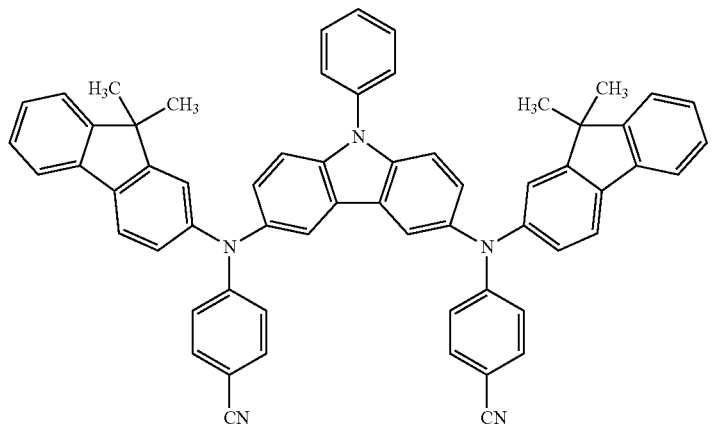
26
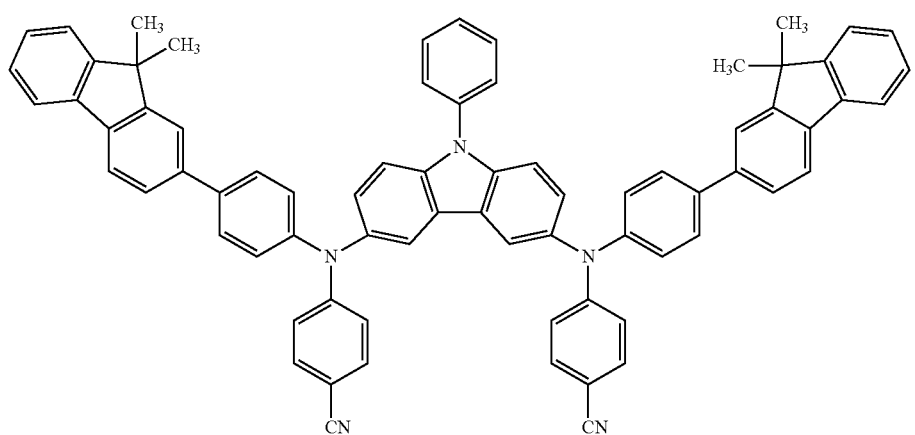

27
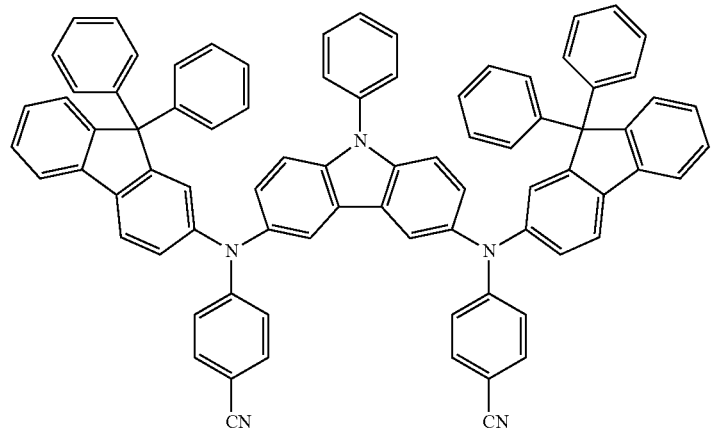
28
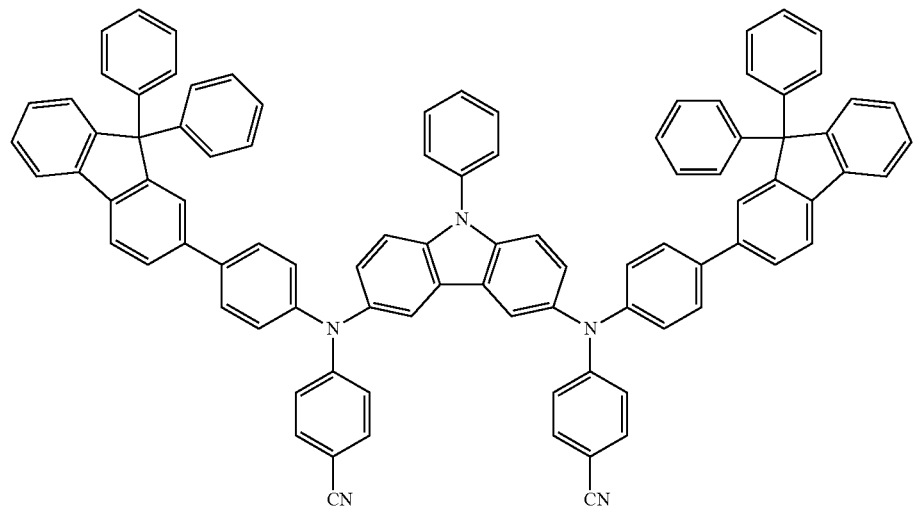
29 30
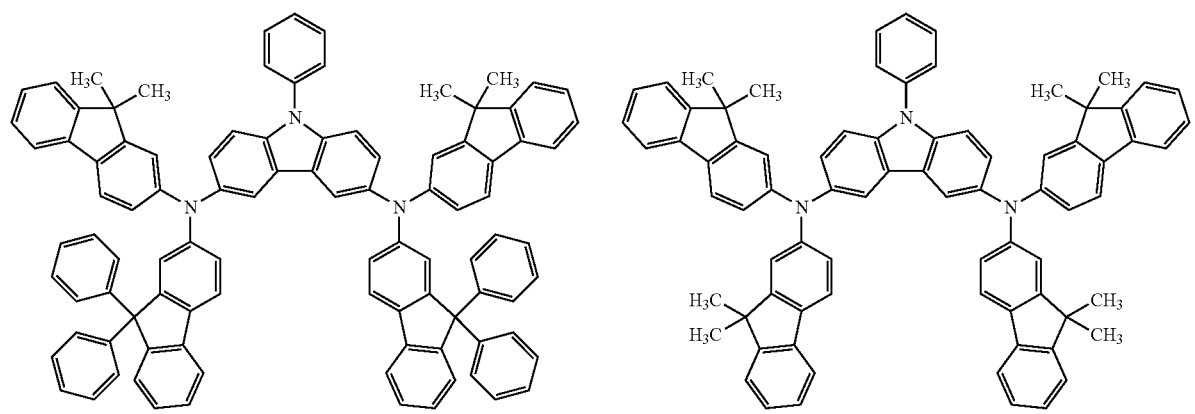

-continued
31
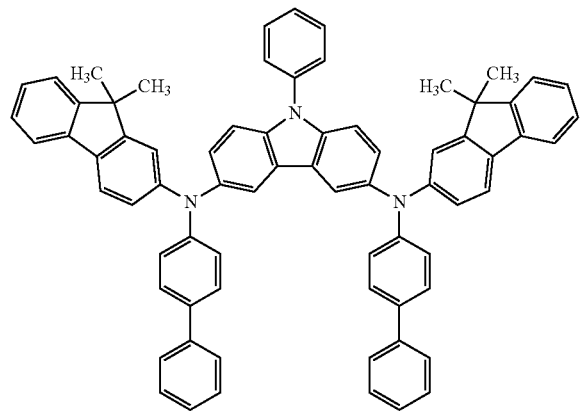
32
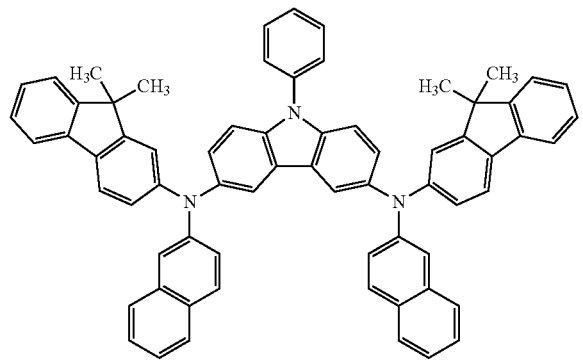
33
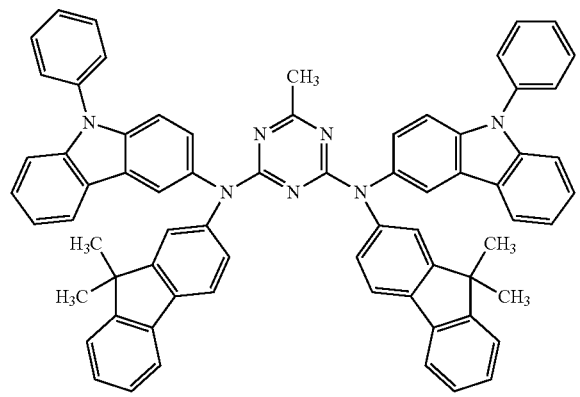
34
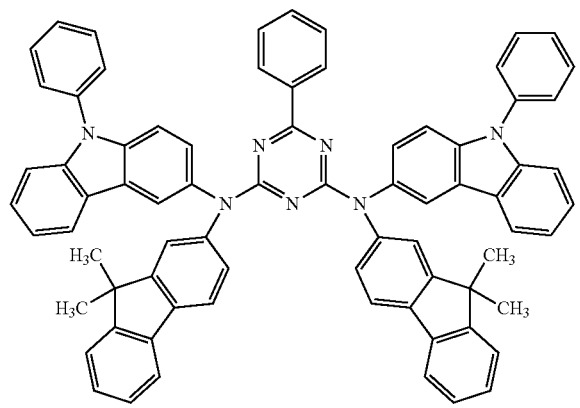
35
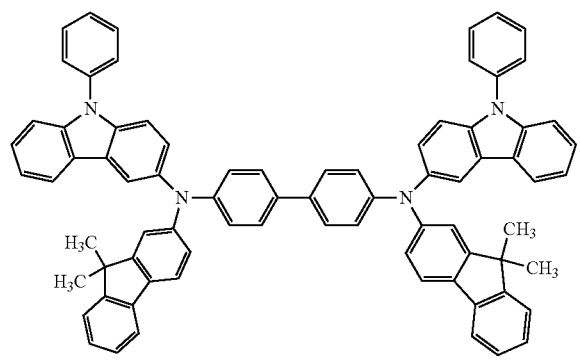
36
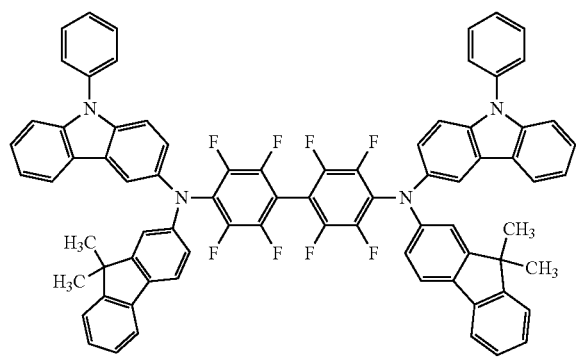

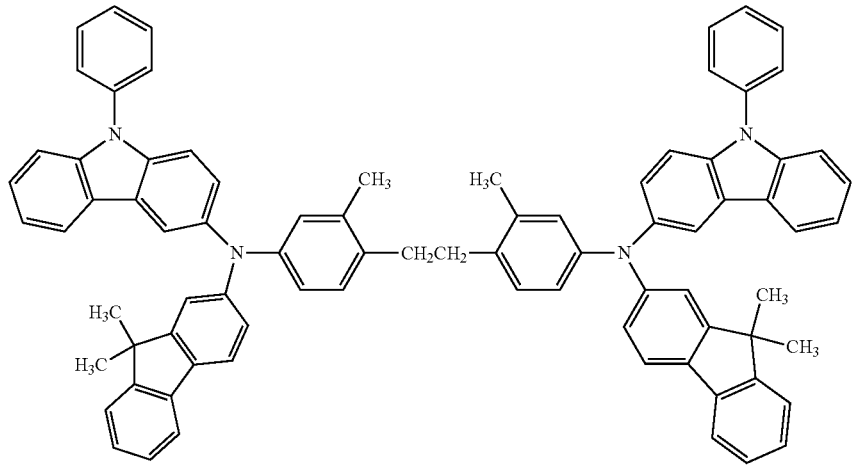

37

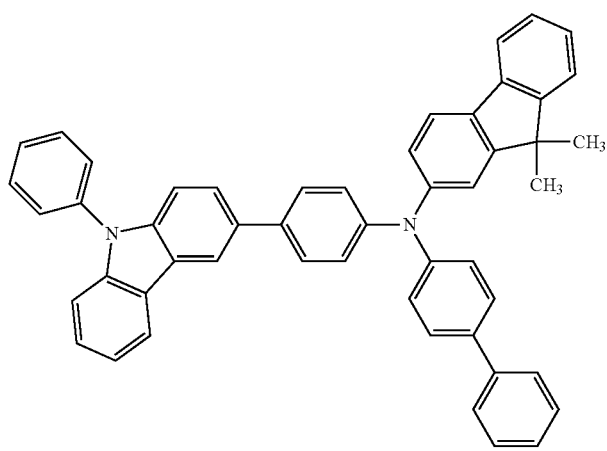

38

When the first layer 6 further includes, in addition to the cyano group-containing compound, the hole transporting compound described above, an amount of the cyano group-containing compound included in the first layer 6 may be about 0.1 parts by weight to about 20 parts by weight, or about 0.5 parts by weight to about 10 parts by weight, or about 0.5 parts by weight to about 5 parts by weight, based on 100 parts by weight of the first layer. Maintaining the amount of the cyano group-containing compound at about 0.1 parts by weight to about 20 parts by weight may help ensure that satisfactory driving voltage decrease and power efficiency increase effects may be obtained.

A thickness of the first layer 6 may be about 10 Å to about 2,100 Å, or about 10 Å to about 500 Å, or about 20 Å to about 200 ↑. Maintaining the thickness of the first layer 6 is at about 10 Å to about 2,100 Å may help ensure that satisfactory driving voltage decrease and power efficiency increase effects may be obtained.

The organic layer 7 may be disposed on the first electrode 6. The term "organic layer" used throughout the specification refers to any intervening layer between the first electrode 5 and the second electrode 9 (although the first layer 6 described above is excluded herein). The organic layer 7 may not be formed of pure organic materials, and may include, e.g., a metal complex.

The organic layer 7 may include an emission layer (EML).

A distance between the first layer 6 and the EML may be about 50 Å or more, or about 100 Å or more, or about 100 Å to about 1,400 Å. Maintaining the distance between the first layer 6 and the EML at about 50 Å or more may help ensure that excitons contained in the EML are not substantially quenched by the cyano group-containing compound contained in the first layer 6, and thus an OLED having excellent qualities may be obtained.

The organic layer 7 may further include, in addition to the EML, at least one of a hole injection layer (HIL), a hole transport layer (HTL), a hole blocking layer (HBL), an electron transport layer (ETL), and an electron injection layer (EIL).

For example, at least one of a HIL and a HTL may be further interposed between the first layer 6 and the EML. For example, a HTL may be further interposed between the first layer 6 and the EML.

The HIL may be formed on the first layer 6 by, e.g., vacuum deposition, spin coating, casting, LB deposition, or the like.

When the HIL is formed using vacuum deposition, the deposition conditions may vary according to a compound that is used to form the HIL and structure and thermal properties of the HIL to be formed. In general, however, conditions for vacuum deposition may include a deposition temperature of about 100 to about 500° C., a vacuum pressure of about $10^{-8}$ to about $10^{-3}$ torr, and a deposition rate of about 0.01 to about 100 Å/sec.

When the HIL is formed using spin coating, the coating conditions may vary according to a compound that is used to form the HIL, and the structure and thermal properties of the HIL to be formed. In general, however, conditions for spin coating may include a coating rate of about 2,000 to about 5,000 rpm and a heat treatment temperature of about 80 to about 200° C., wherein the heat treatment is performed to remove a solvent after coating.

The HIL may be formed of any suitable material that is commonly used to form a HIL. Examples of the material that can be used to form the HIL may include a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline)/poly(4-styrenesulfonate (PANI/PSS), but are not limited thereto.

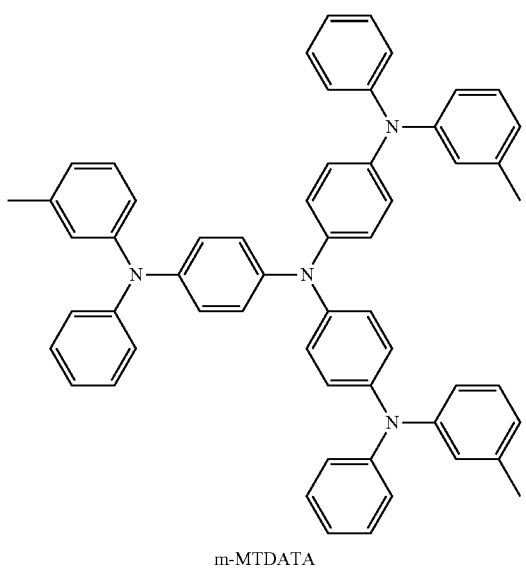

m-MTDATA

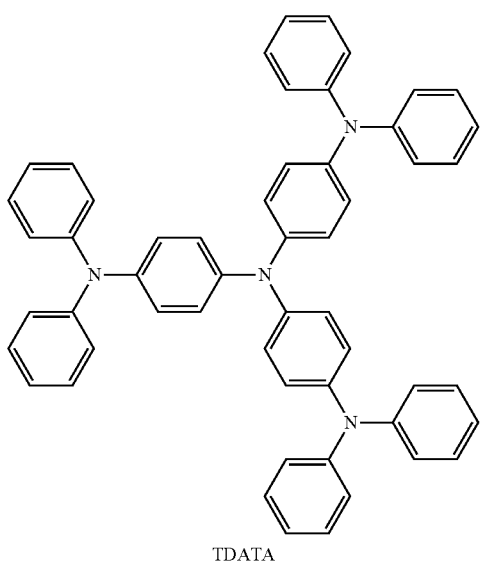

TDATA

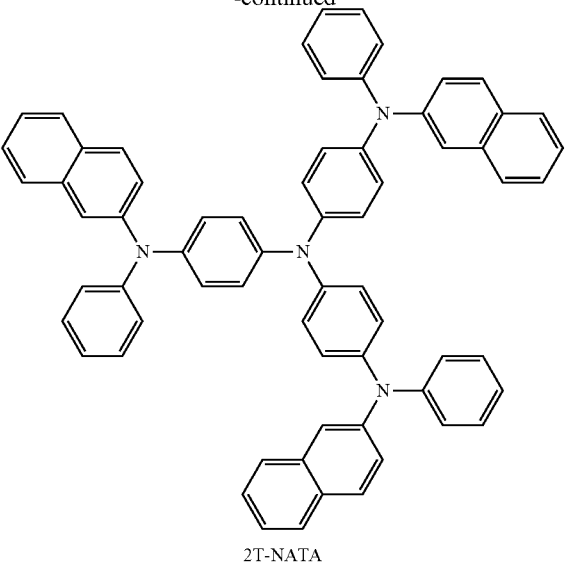

2T-NATA

The HIL may have a thickness of about 50 Å to about 10,000 Å, for example, a thickness of about 100 Å to about 2,500 Å. Maintaining the thickness of the HIL at about 50 Å to about 10,000 Å may help ensure that the HIL has an excellent hole injecting ability without a substantial increase in driving voltage.

Then, a HTL may be formed on the HIL or the first layer 6 by using, e.g., vacuum deposition, spin coating, casting, Langmuir-Blodgett (LB) deposition, or the like. When the HTL is formed by vacuum deposition or spin coating, the conditions for deposition and coating may be similar to those for the formation of the HIL, although the conditions for the deposition and coating may vary according to the material that is used to form the HTL.

The HTL may be formed of the compound represented by Formula 41 or 42 described above.

The HTL may have a thickness of about 50 Å to about 10,000 Å, for example, a thickness of 100 Å to about 2,500 Å. Maintaining the thickness of the HTL at about 50 Å to about 10,000 Å may help ensure that an excellent hole transporting ability of the HTL is obtained without a substantial increase in driving voltage.

Then, an EML may be formed on the HTL by using, e.g., vacuum deposition, spin coating, casting, LB deposition, or the like. When the EML is formed using vacuum deposition or spin coating, the conditions for deposition and coating may be similar to those for the formation of the HIL, although the conditions for deposition and coating may vary according to the material that is used to form the EML.

The EML may include a compound, or a combination of a host and a dopant. Examples of the host material may include $Alq_3$, 4,4'-N,N'-dicarbazole-biphenyl (CBP), TCTA, 1,3,5-tris(N-phenylbenzimidazole-2-yl)benzene) (TPBI), E3, distyrylarylene (DSA), a compound represented by Formula 51, a compound represented by Formula 52, a compound represented by Formula 53, or a compound represented by Formula 54, but are not limited to.

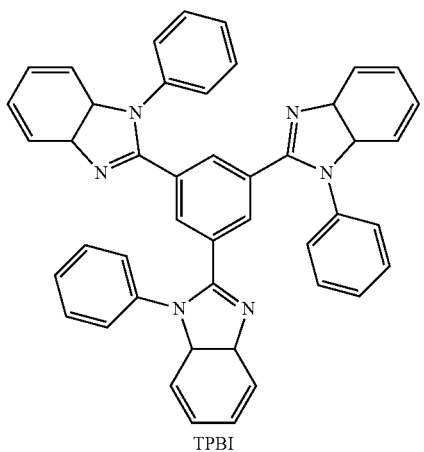

TPBI

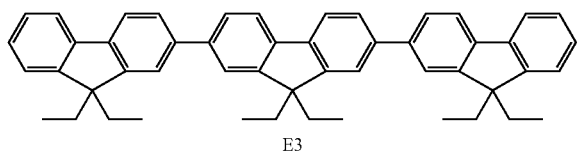

E3

Formula 51

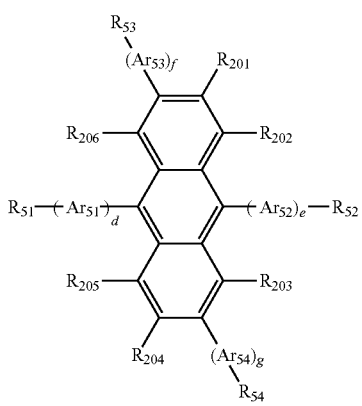

Formula 52

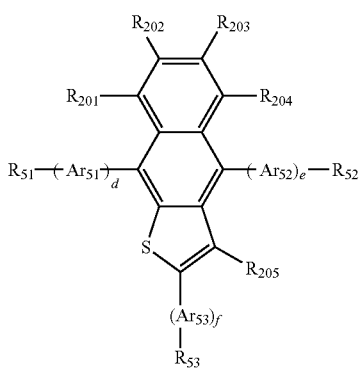

Formula 53

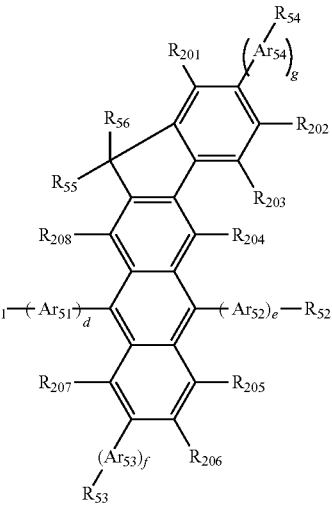

Formula 54

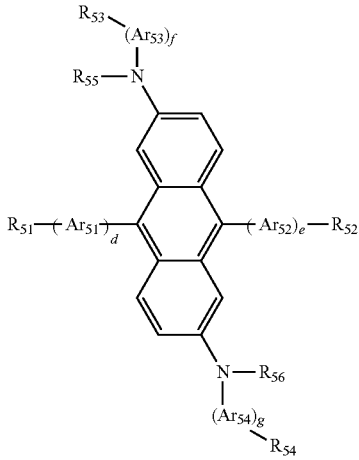

In Formulae 51 through 54 above, $Ar_{51}$, $A_{52}$, $Ar_{53}$ and $Ar_{54}$ may be defined as described above in connection with $Ar_1$.

In Formulae 51 through 54, $Ar_{51}$, $A_{52}$, $Ar_{53}$ and $Ar_{54}$ may each independently be a phenylene group, a naphthylene group, an anthrylene group, or a phenyl-substituted anthrylene group, but are not limited thereto.

In Formulae 51 through 54, $R_{201}$ through $R_{209}$ and $R_{51}$ through $R_{56}$ may be defined as described above in connection with $Ar_2$. For example, $R_{201}$ through $R_{209}$ may be hydrogen.

In Formulae 51 through 54, d, e, f and g may each independently be an integer from 0 to 10. For example, d, e, f, and g may each independently be 0, 1, or 2, but are not limited thereto.

In Formulae 51 through 54, $R_{51}$ through $R_{56}$ may each independently be a hydrogen atom, a methyl group, an ethyl group, a propyl group, a butyl group, a phenyl group, a naphthyl group, an anthryl group, a pyrenyl group, a carbazolyl group, or —N($Q_2$)($Q_3$), wherein $Q_2$ and $Q_3$ are each independently a methyl group, a phenyl group, a naphthyl group, or an anthryl group.

In an implementation, the EML of the organic layer 7 may include one compound represented by Compounds 51 through 58 as a host, but is not limited thereto.

Compound 51
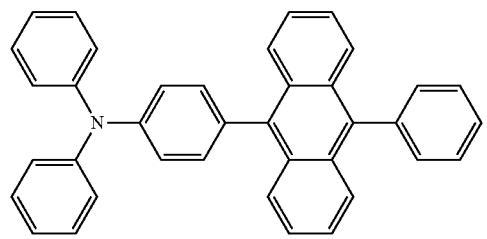
Compound 52
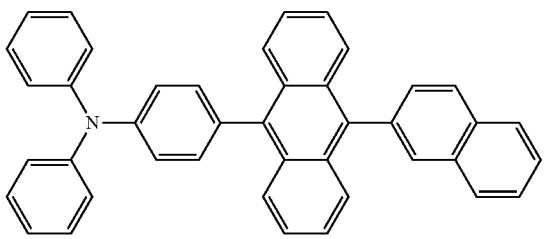
Compound 53
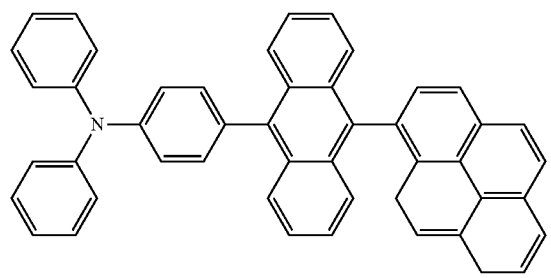
Compound 54
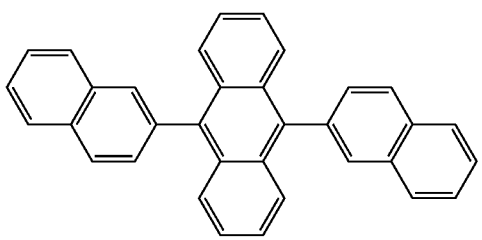
Compound 55
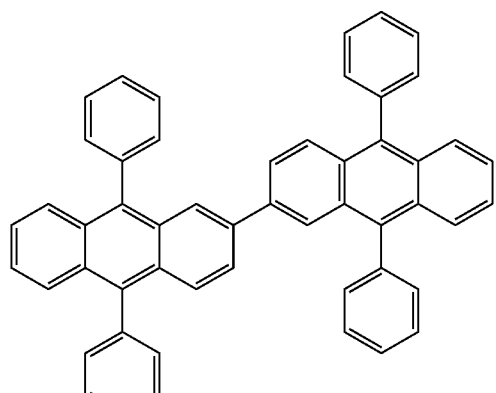
Compound 56
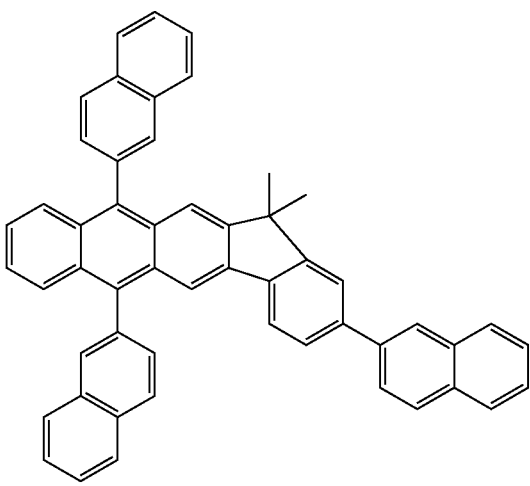
Compound 57
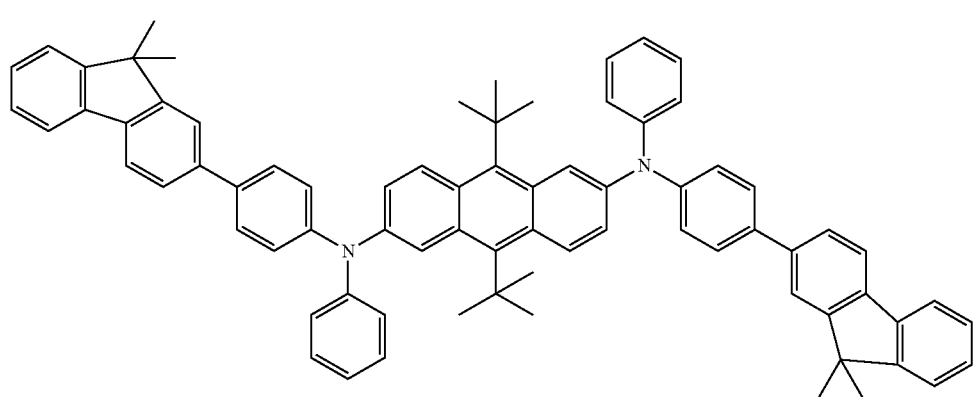

-continued

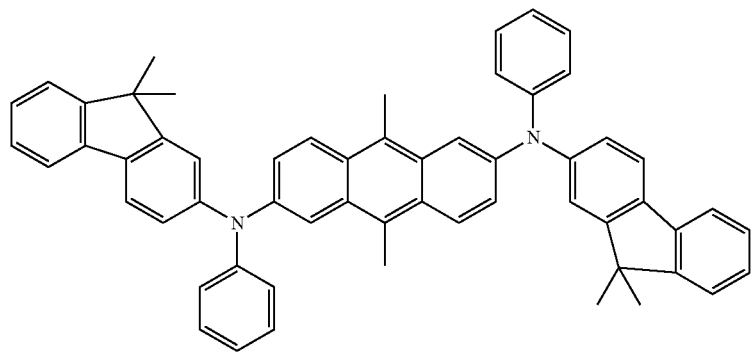

Compound 58

Examples of red dopants may include PtOEP, Ir(piq)$_3$, and Btp$_2$Ir(acac), but are not limited thereto.

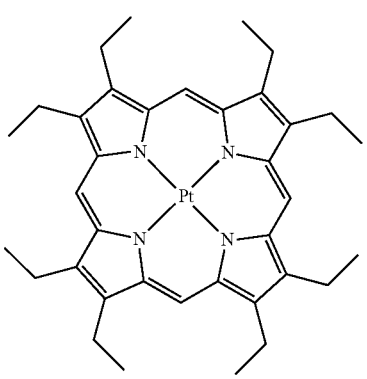

PtOEP

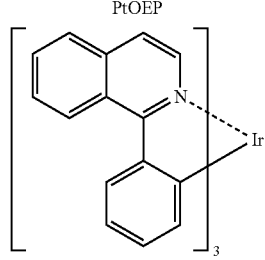

Ir(piq)$_3$

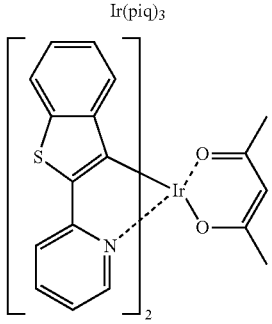

Btp$_2$Ir(acac)

Examples of green dopants may include Ir(ppy)$_3$ (ppy=phenylpyridine), Ir(ppy)$_2$(acac), and Ir(mpyp)$_3$, a compound represented by any one of Formulae 51 through 54, a compound represented by Formula 71 below, and a compound represented by Formula 72, but are not limited thereto.

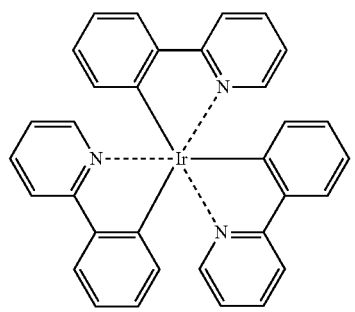

Ir(ppy)$_3$

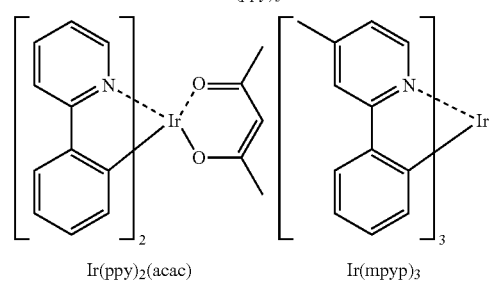

Ir(ppy)$_2$(acac)   Ir(mpyp)$_3$

Formula 71

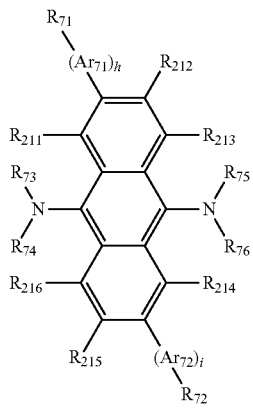

Formula 72

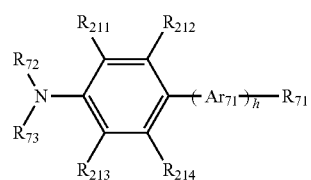

In Formulae 71 and 72, $Ar_{71}$ and $Ar_{72}$ may be defined as described above in connection with $Ar_1$.

In Formulae 71 and 72, $Ar_{71}$ and $Ar_{72}$ may each independently be an ethenylene group, a phenylene group, a naphthylene group, an anthrylene group, or a phenyl-substituted anthrylene group, but are not limited thereto.

In Formulae 71 and 72, $R_{211}$ through $R_{216}$ and $R_{71}$ through $R_{76}$ may be defined as described above in connection with $Ar_2$. For example, $R_{211}$ through $R_{216}$ may be hydrogen.

In Formula 71 and 72, h and i may each independently be an integer from 0 to 10. For example, h and i may be each independently 0, 1 or 2.

In Formulae 71 and 72, $R_{71}$ through $R_{76}$ may each independently be a methyl group, an ethyl group, an ethenyl group, a phenyl group, a methylphenyl group, a naphthyl group, a methylnaphthyl group, an anthryl group, a methylanthryl group, a pyrenyl group, or —$N(Q_2)(Q_3)$, wherein $Q_2$ and $Q_3$ are each independently a methyl group, a phenyl group, a naphthyl group, or an anthryl group.

In another implementation, the EML may include one compound represented by Compounds 51 through 58 above, and Compounds 71 through 76 below, as a green dopant, but is not limited thereto.

Compound 71

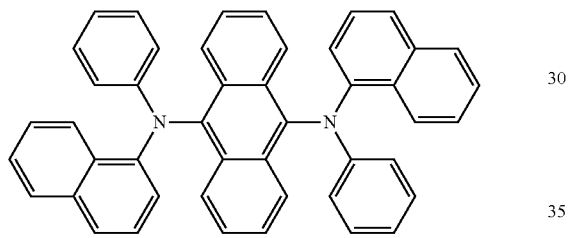

Compound 72

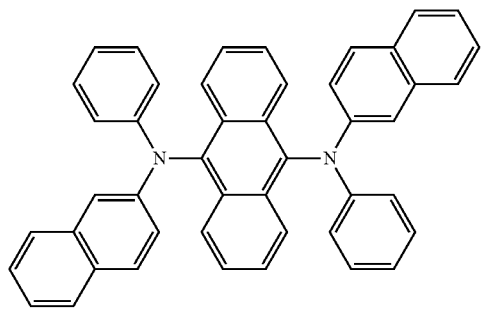

Compound 73

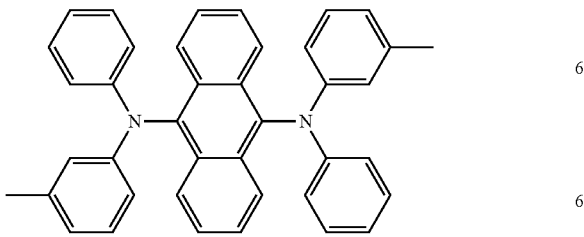

Compound 74

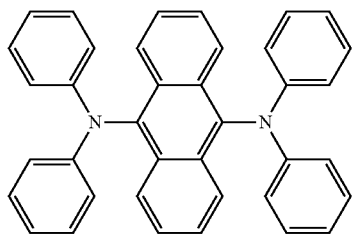

Compound 75

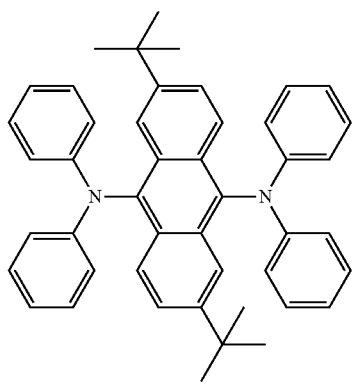

Compound 76

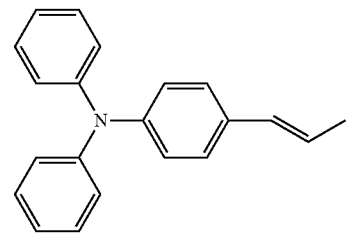

Examples of blue dopants may include $F_2Irpic$, $(F_2ppy)_2Ir(tmd)$, $Ir(dfppz)_3$, ter-fluorene, 4,4'-bis(4-diphenyl amiostyryl)biphenyl (DPAVBi), 2,5,8,11-tetra-tert-butyl perylene (TBPe), compounds represented by Formulae 51, 54, 81, and 82, but are not limited thereto.

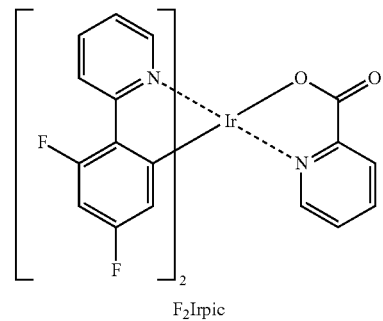

$F_2Irpic$

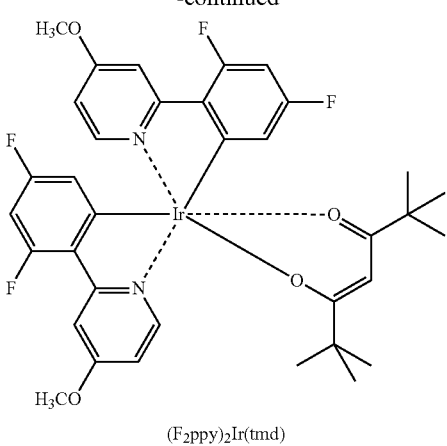

(F₂ppy)₂Ir(tmd)

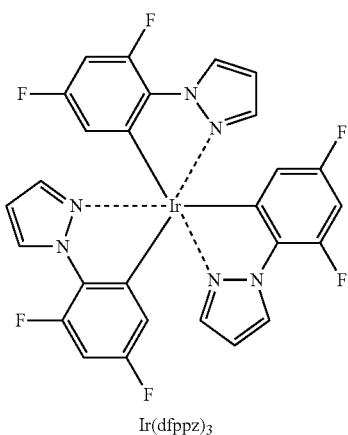

Ir(dfppz)₃

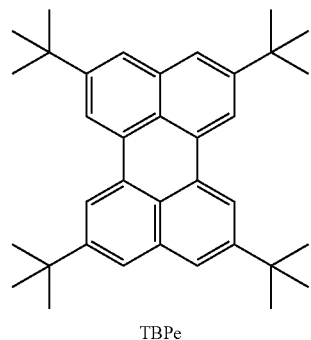

TBPe

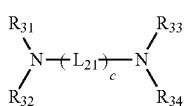

Formula 81

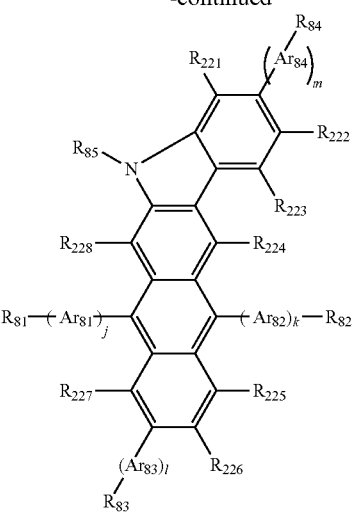

Formula 82

In Formula 81, $L_{21}$ may be a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, or a substituted or unsubstituted $C_4$-$C_{30}$ heteroarylene group; c may be an integer from 1 to 20; c groups of $L_{21}$ in -($L_{21}$)$_c$- may be identical to or different from each other; $R_{31}$ through $R_{34}$ may each independently be a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_5$-$C_{30}$ aryl group, or a substituted or unsubstituted $C_4$-$C_{30}$ heteroaryl group.

In Formula 81, $L_{21}$ may be defined as described above in connection with $Ar_1$ (the description of —N($Q_1$)- is excluded), and $R_{31}$ through $R_{34}$ may be defined as described above in connection with $Q_1$ (the description of —N($Q_2$)($Q_3$) is excluded).

In an example of Formula 81, $L_{21}$ may be an ethenylene group, a prophenylene group, or a phenylene group.

In anther example of Formula 81, c may be 1, 2, 3, 4, 5, or 6.

In another example of Formula 81, $R_{31}$ through $R_{34}$ may each independently be a hydrogen atom, a methyl group, an ethyl group, a propyl group, a butyl group, a methoxy group, an ethoxy group, a propoxy group, a butoxy group, a phenyl group, a naphthyl group, or an anthryl group.

In Formula 81, c groups of $L_{21}$ in -($L_{21}$)$_c$- may be identical to or different from each other. For example, when c is 2, the two groups of $L_{21}$ may be both phenylene groups, or one of the two may be a phenylene group, and the other may be an ethenylene group.

In Formula 82, $Ar_{81}$ and $Ar_{84}$ may be defined as described above in connection with Ar1.

In Formula 82, $Ar_{31}$, $A_{32}$, $Ar_{33}$ and $Ar_{34}$ may each independently be a phenylene group, a naphthylene group, an anthrylene group, or a phenyl-substituted anthrylene group, but are not limited thereto.

In Formula 82, $R_{221}$ through $R_{228}$ and $R_{81}$ through $R_{85}$ may be defined as described above in connection with $Ar_2$. For example, $R_{221}$ through $R_{228}$ may be hydrogen.

In Formula 82, j, k, l, and m may each independently be an integer from 0 to 10. For example, j, k, l, and m may each independently be 0, 1, or 2.

In Formula 82, $R_{81}$ through $R_{85}$ may each independently be a hydrogen atom, a methyl group, an ethyl group, a propyl group, a butyl group, a phenyl group, a naphthyl group, an anthryl group, a pyrenyl group, a carbazolyl group, or —N($Q_2$)($Q_3$), wherein $Q_2$ and $Q_3$ are each independently a methyl group, a phenyl group, a naphthyl group, or an anthryl group.

The compound of Formula 81 may be Compound 40 below, but is not limited thereto:

Compound 40

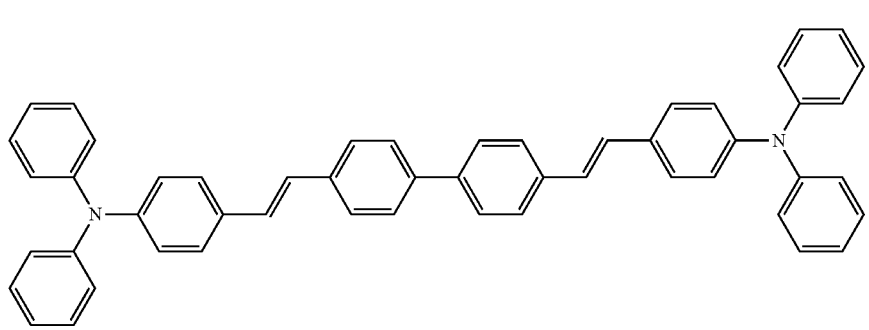

The compound of Formula 82 may be represented by Compound 41 or 42 below, but is not limited thereto:

Compound 41

Compound 42

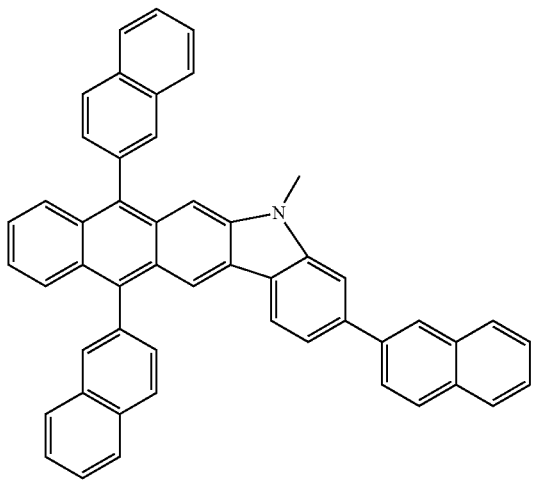

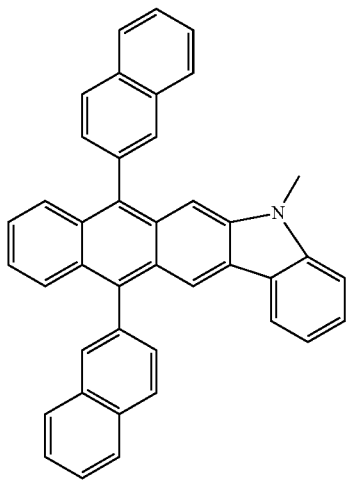

In an implementation, the EML may include any one of Compounds 40 through 42, 51 through 55, 57, and 58, as a blue dopant, but is not limited thereto.

When a dopant and a host are used together as materials for the EML, the amount of the dopant may be in a range of about 0.01 to about 15 parts by weight based on 100 parts by weight of the host, but is not limited thereto.

The EML may have a thickness of about 100 Å to about 1,000 Å, for example, about 200 Å to about 600 Å. Maintaining the thickness of the EML at about 100 Å to about 1,000 Å may help ensure that the EML has excellent emitting ability without a substantial increase in driving voltage.

When a phosphorescent dopant is also used to form the EML, a HBL may be formed between the HTL and the EML by using, e.g., vacuum deposition, spin coating, casting, LB deposition, or the like, in order to prevent diffusion of triplet excitons or holes into an ETL. When the HBL is formed using vacuum deposition or spin coating, the conditions for deposition and coating may be similar to those for the formation of the HIL, although the conditions for deposition and coating may vary according to the material that is used to form the HBL. Any suitable material that is commonly used to form a HBL may be used. Examples of materials for forming the HBL may include an oxadiazole derivative, a triazole derivative, and a phenanthroline derivative, but are not limited thereto.

The HBL may have a thickness of about 50 Å to about 1,000 Å, for example, about 100 Å to about 400 Å. Maintaining the thickness of the HBL at about 50 Å to about 1,000 Å may help ensure that the HBL has an excellent hole blocking ability without a substantial increase in driving voltage.

Then, an ETL may be formed on the HBL or EML by, e.g., vacuum deposition, spin coating, casting, or the like. When the ETL is formed using vacuum deposition or spin coating, the deposition and coating conditions may be similar to those for formation of the HIL, although the deposition and coating conditions may vary according to a compound that is used to form the ETL. A material for forming the ETL may be any suitable material that can stably transport electrons injected from an electron injecting electrode (cathode). Examples of materials for forming the ETL may include a quinoline derivative, such as tris(8-quinolinorate)aluminum ($Alq_3$), TAZ, and Balq, but are not limited thereto.

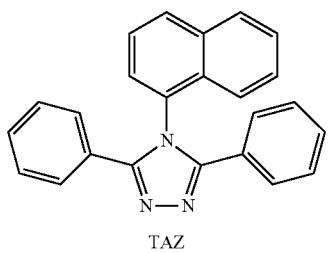

TAZ

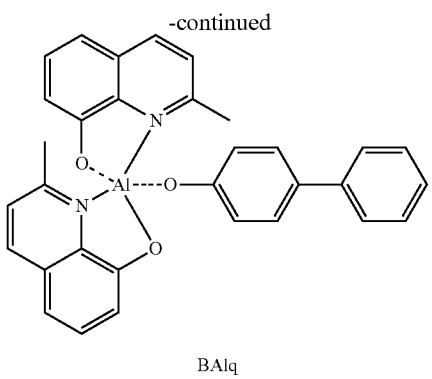

BAlq

The ETL may have a thickness of about 100 Å to about 1,000 Å, for example, about 150 Å to about 500 Å. Maintaining the thickness of the ETL at about 100 Å to about 1,000 Å may help ensure that the ETL has satisfactory electron transporting ability without a substantial increase in driving voltage.

Then, an EIL may be formed on the ETL. The EIL may be formed of any suitable material allowing electrons to be easily injected from the cathode.

Examples of materials for forming the EIL may include LiF, NaCl, a CsF, $Li_2O$, and BaO, which are known in the art. Deposition and coating conditions for forming the EIL are similar to those for formation of the HIL, although the deposition and coating conditions may vary according to a material that is used to form the EIL.

The EIL may have a thickness of about 1 Å to 100 Å, for example, about 5 Å to about 90 Å. Maintaining the thickness of the EIL at about 1 Å to 100 Å may help ensure that the EIL has satisfactory electron injecting properties without a substantial increase in a driving voltage of the organic light emitting diode.

Finally, the second electrode 9 is formed on the organic layer 7. The second electrode 9 may be a cathode, which is an electron injecting electrode. A material for forming the second electrode 9 may include, e.g., a metal, an alloy, an electrically conductive compound, which have a low-work function, or a mixture thereof. In this regard, the second electrode 9 may be formed of, e.g., lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In addition, the transmission electrode may be formed of ITO or IZO to manufacture a top-emission type light-emitting device.

For example, the OLED may include an Al-based reflective layer formed of Al, Ni, and La; a transparent conductive layer formed of ITO; a first layer containing a cyano group-containing compound represented by any one of Formulae 1A through 20B (herein, the first layer may further, optionally include the hole transporting compound represented by Formula 42); a HTL including the compound represented by Formula 42; an EML including a host (a compound represented by any one of Formulae 51 through 54) and a dopant (a compound represented by any one of Formulae 51 through 54, 71, and 72); an ETL; an EIL; and a second electrode, which are sequentially stacked in this order, and may emit green light having high quality. The green light may be emitted according to a fluorescent light emission mechanism. A maximum emission peak wavelength of the green light may be about 490 to about 560 nm.

Alternatively, for example, the OLED may include an Al-based reflective layer formed of Al, Ni, and La; a transparent conductive layer formed of ITO; a first layer containing a cyano group-containing compound represented by any one of Formulae 20A and 20B (herein, the first layer may further, optionally include any one of Compounds 1 through 37 being the hole transporting compound); a HTL including any one of Compounds 1 through 37; an EML including a host (any one of Compounds 51 through 58) and a dopant(any one of Compounds 40 through 42 and 51 through 58); an ETL; an EIL; and a second electrode, which are sequentially stacked in this order, and may emit green light having high quality.

Figure 4:
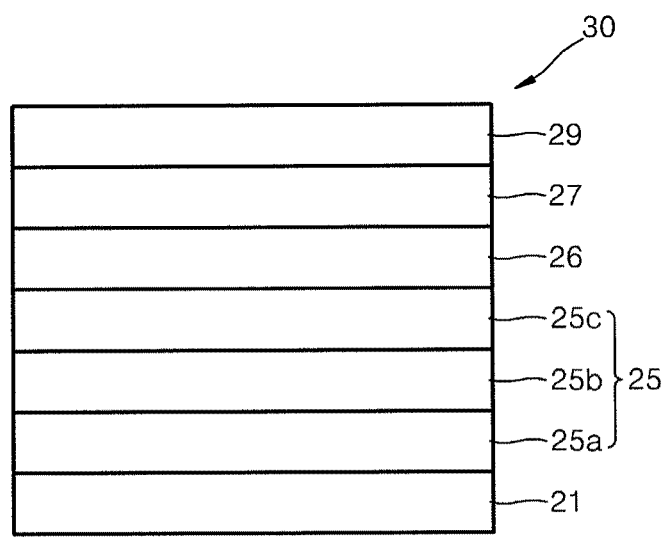
FIG. 4 illustrates is a cross-sectional view of a structure of an OLED according to another embodiment.

FIG. 4 illustrates a schematic sectional view of an OLED 30 according to another embodiment. Referring to FIG. 4, the OLED 30 according to the present embodiment may include, e.g., a substrate 21, a first electrode 25, a first layer 26 containing a cyano group-containing compound, an organic layer 27, and a second electrode 29, wherein the second electrode 25 includes an Al-based reflective layer 25a including nickel (Ni) and a first element, a transparent conductive layer 25b, and a second element-containing zinc oxide layer 25c, which are disposed in this order on the substrate 21. The substrate 21, the first layer 26 containing a cyano group-containing compound, the organic layer 27, the second electrode 29, the Al-based reflective layer 25a including Ni and the first element, and the transparent conductive layer 25b are the same as described above with reference to FIG. 1, and thus the above description may be referred to.

Referring to FIG. 4, in the OLED 30 according to the present embodiment, the first electrode 25 may further include a second element-containing zinc oxide layer 25c, compared to the OLED 10 in FIG. 1. The second element-containing zinc oxide layer 25c may lower a hole injection barrier by increasing the work function of the first electrode 25, and thus, may allow holes to be easily injected into the organic layer 27 from the first electrode 25.

In this regard, in the first layer 26 containing a cyano group-containing compound, the cyano group-containing compound may further enhance hole injecting characteristics of the second element-containing zinc oxide layer 25c. Thus, an OLED having lower driving voltage and better power efficiency characteristics may be obtained.

The second element in the second element-containing zinc oxide layer 25c may include at least one of aluminum (Al), indium (In), gallium (Ga), germanium (Ge), gadolinium (Gd), zirconium (Zr), molybdenum (Mo), and nickel (Ni). For example, the second element may include aluminum (Al). The second element may be aluminum (Al), but is not limited thereto.

The second element may be included in the second element-containing zinc oxide layer 25c in an amount of about 0.5 parts by weight to about 10 parts by weight, based on 100 parts by weight of the second element-containing zinc oxide layer 25c. Maintaining the amount of the second element in the second element-containing zinc oxide layer 25c at about 0.5 parts by weight to about 10 parts by weight may help ensure that the second element-containing zinc oxide layer 25c has excellent hole transporting ability without a substantial increase in electrical resistance or a substantial reduction in the transmittance of visible light. For example, the amount of the second element may be about 0.5 to about 5 parts by weight, based on 100 parts by weight of the second element-containing zinc oxide layer 25c, but is not limited thereto.

The second element-containing zinc oxide layer 25c may have a thickness of about 1 Å to about 800 Å, for example, about 10 Å to 500 Å. Maintaining the thickness of the second element-containing zinc oxide layer 25c at about 1 Å to about 800 Å may help ensure that excellent efficiency characteristics are attained without a substantial increase in driving voltage.

For example, the OLED may include an Al-based reflective layer formed of Al, Ni, and La; a transparent conductive layer formed of ITO; an Al-containing zinc oxide layer; a first layer containing a cyano group-containing compound represented by any one of Formulae 1A through 20B (herein, the first layer may further, optionally include the hole transporting compound represented by Formula 42); a HTL including the compound represented by Formula 42; an EML including a host (a compound represented by any one of Formulae 51 through 54) and a dopant (a compound represented by any one of Formulae 51 through 54, and 72); an ETL; an EIL; and a second electrode, which are sequentially stacked in this order, and may emit green light having high quality. The green light may be emitted according to a fluorescent light emission mechanism. The maximum emission peak wavelength of the green light may be about 490 to about 560 nm.

Alternatively, for example, the OLED may include an Al-based reflective layer formed of Al, Ni and La; a transparent conductive layer formed of ITO; an Al-containing zinc oxide layer; a first layer containing a cyano group-containing compound represented by any one of Formulae 20A and 20B (herein, the first layer may further, optionally include any one of Compounds 1 through 37 being the hole transporting compound); a HTL including any one of Compounds 1 through 37; an EML including a host (any one of Compounds 51 through 58) and a dopant(any one of Compounds 40 through 42 and 51 through 58); an ETL; an EIL; and a second electrode, which are sequentially stacked in this order, and may emit green light having high quality.

The OLEDs 10 and 30 according to the embodiments are illustrated in FIGS. 1 and 4. However, the embodiments are not limited thereto.

For example, any of the OLEDs 10 and 30 may further include a metal layer between the Al-based reflective layer 5a (25a) and the substrate 1 (21). The metal layer may function as a barrier layer that blocks diffusion of Al in the Al-based reflective layer 5a (25a) into the substrate 1 (21). The metal layer may include at least one of molybdenum (Mo), tungsten (W), titanium (Ti), palladium (Pd), platinum (Pt), and gold (Au), but is not limited thereto. For example, the metal layer may include a titanium (Ti) layer. The metal layer may have a thickness of about 20 nm to about 200 nm, for example, about 50 nm to about 100 nm. Maintaining the thickness of the metal layer at about 20 nm to about 200 nm may help ensure that diffusion of aluminum (Al) may be effectively prevented. However, the thickness of the metal layer is not limited thereto.

The OLED may include at least one of a HIL and a HTL between the first electrode and the first layer. That is, for example, the OLED may include a substrate, a first electrode, a first HTL, a first layer, a second HTL, an EML, an ETL, an EIL, and a second electrode, which are sequentially stacked in this order.

Hereinafter, one or more embodiments will be described in detail with reference to the following examples. However, these examples are not intended to limit the purpose and scope of the one or more embodiments.

EXAMPLES

Comparative Example 1

A 15 Ω/cm² (1200 Å) ITO glass substrate (available from Corning Co.) was cut to a size of 50 mm×50 mm×0.7 mm, ultrasonically washed with isopropyl alcohol for 5 minutes and then washed with pure water for 5 minutes, and washed again with UV ozone for 30 minutes. The resultant ITO glass substrate was used as a substrate and an anode. Then, m-MT-DATA was vacuum-deposited on the resultant ITO glass substrate to form a HIL having a thickness of 750 Å, and then Compound 5 above was vacuum-deposited on the HIL to form a HTL having a thickness of 750 Å. 97 wt % of Compound 56 above as a host and 3 wt % of Compound 58 above as a dopant were deposited on the HTL to form an EML having a thickness of 200 Å. Alq3 was vacuum-deposited on the EML to form an ETL having a thickness of 300 Å. Liq was vacuum-deposited on the ETL to form an EIL having a thickness of 5 Å and Mg and Al were vacuum-deposited on the EIL to form a cathode having a thickness of 160 Å. Next, Alq3 was deposited on the cathode to form a protection layer having a thickness of 600 Å, thereby completing the manufacture of an OLED.

Example 1

An OLED was manufactured in the same manner as in Comparative Example 1, except that as a substrate and an anode, a glass substrate on which an AlNiLa layer having a thickness of 5000 Å (in the AlNiLa layer, the amount of nickel (Ni) was 2 wt %, and the amount of lanthanum (La) was 0.3 wt %), an ITO layer having a thickness of 70 Å as a transparent conductive layer, and an Al-containing zinc oxide layer having a thickness of 400 Å (the concentration of Al was 2 parts by weight based on 100 parts by weight of the Al-containing zinc oxide layer) were sequentially formed in this order, was used instead of the ITO glass substrate; and a first layer including the compound represented by Formula 20A (where $R_{109}$ is —F) and Compound 14 was formed instead of the HIL on the Al-containing zinc oxide layer and then the HTL was formed, wherein the amount of the compound represented by Formula 20A was 1 part by weight based on 100 parts by weight of the first layer.

Example 2

An OLED was manufactured in the same manner as in Example 1, except that the amount of the compound represented by Formula 20A was 3 parts by weight based on 100 parts by weight of the first layer.

Evaluation

Driving voltages of the OLEDs manufactured in Comparative Example 1 and Examples 1 and 2 was measured using a 238 High Current Source (KEITHLEY). Power efficiency of the OLEDs manufactured in Comparative Example 1 and Examples 1 through 2 was measured using a PR650 Spectroscan Source Measurement Unit (PhotoResearch). The results are shown in Table 1 below.

TABLE 1

| | Power efficiency (lm/W) | Driving voltage (V) |
|---|---|---|
| Comparative Example 1 | 14.5 | 5.1 |
| Example 1 | 18.6 | 4.5 |
| Example 2 | 16.3 | 4.6 |

Referring to Table 1, it may be confirmed that the OLEDS of Examples 1 through 2 exhibited lower driving voltages and higher power efficiencies than the OLED of Comparative Example 1.

As described above, an OLED according to an embodiment may have excellent driving voltage characteristics and excellent power efficiency characteristics.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:
    a substrate;
    a first electrode on the substrate;
    a second electrode;
    an organic layer between the first electrode and the second electrode, the organic layer including an emission layer; and
    a first layer including a cyano group-containing compound and a hole transporting compound, the first layer being between the first electrode and the emission layer and a distance between the first layer and the emission layer being about 50 Å or greater,
    wherein:
    the first electrode includes an Al-based reflective layer and a transparent conductive layer sequentially stacked on the substrate, the Al-based reflective layer including a first element and nickel (Ni),
    the first element includes at least one of lanthanum (La), cerium (Ce), praseodymium (Pr), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu), and
    the hole transporting compound includes a compound represented by Formula 41 or 42 below:

Formula 41
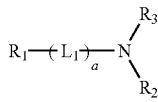

Formula 42
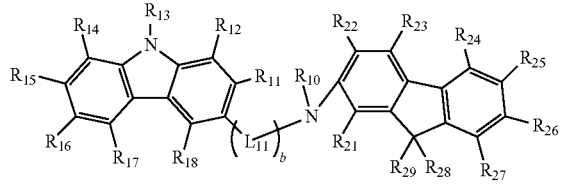

wherein $R_{10}$ is represented by —$(Ar_1)_n$—$Ar_2$;
$R_{16}$ is represented by —$(Ar_{11})_m$—$Ar_{12}$;
$Ar_1, Ar_{11}, L_1$, and $L_{11}$ are each independently a substituted or unsubstituted $C_1$-$C_{30}$ alkylene group, a substituted or unsubstituted $C_2$-$C_{30}$ alkenylene group, a substituted or unsubstituted $C_5$-$C_{30}$ arylene group, a substituted or unsubstituted $C_4$-$C_{30}$ heteroarylene group, or a group represented by —$N(Q_1)$-;
n, m, a, and b are each independently an integer from 0 to 10;
$R_1$ through $R_3$, $R_{11}$ through $R_{15}$, $R_{17}$, $R_{18}$, $R_{21}$ through $R_{29}$, $Ar_2$, $Ar_{12}$ and $Q_1$ are each independently a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, a $C_4$-$C_{30}$ heteroaryl group, or a group represented by —$N(Q_2)(Q_3)$; and
$Q_2$ and $Q_3$ are each independently a hydrogen atom, a halogen atom, a hydroxyl group, a cyano group, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_1$-$C_{30}$ alkylthiol group, a substituted or unsubstituted $C_5$-$C_{30}$ aryl group, or a substituted or unsubstituted $C_4$-$C_{30}$ heteroaryl group,
wherein n groups of $Ar_1$ in —$(Ar_1)_n$— are identical to or different from each other, m groups of $Ar_{11}$ in —$(Ar_{11})_m$— are identical to or different from each other, a groups of $L_1$ in -$(L_1)_a$- are identical to or different from each other, and b groups of $L_{11}$ in -$(L_{11})_b$- are identical to or different from each other.

2. The organic light-emitting device as claimed in claim 1, wherein the first electrode further includes a second element-containing zinc oxide layer, the second element including at least one of aluminum (Al), indium (In), gallium (Ga), germanium (Ge), gadolinium (Gd), zirconium (Zr), molybdenum (Mo), and nickel (Ni).

3. The organic light-emitting device as claimed in claim 2, wherein the Al-based reflective layer, the transparent conductive layer, and the second element-containing zinc oxide layer are sequentially stacked in this order on the substrate.

4. The organic light-emitting device as claimed in claim 2, wherein the second element is included in an amount of about 0.5 to about 10 parts by weight, based on 100 parts by weight of the second element-containing zinc oxide layer.

5. The organic light-emitting device as claimed in claim 2, wherein the Al-based reflective layer includes La, Ni, and Al.

6. The organic light-emitting device as claimed in claim 1, wherein the cyano group-containing compound includes any one of compounds represented by Formulae 1 through 20:

Formula 1
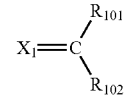

Formula 2
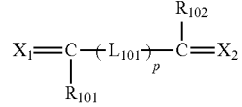

Formula 3
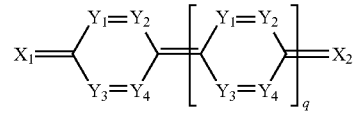

-continued

Formula 4

Formula 5

Formula 6

Formula 7

Formula 8

Formula 9

Formula 10

Formula 11

-continued

Formula 12

Formula 13

Formula 14

Formula 15

Formula 16

Formula 17

Formula 18

Formula 19

-continued

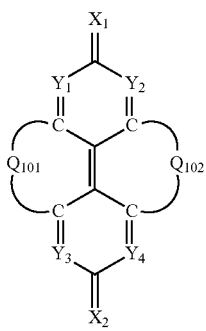

Formula 20

Formula 30A

Formula 30B

Formula 30C

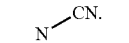

Formula 30D in Formulae 1 through 20, $X_1$ through $X_4$ are each independently represented by one of Formulae 30A through 30D;

$Y_1$ through $Y_8$ are each independently N or $C(R_{103})$;

$Z_1$ through $Z_4$ are each independently C or N;

$A_1$ and $A_2$ are each independently —O—, —S—, —N($R_{104}$), or —C($R_{105}$)($R_{106}$)—;

$Q_{101}$ and $Q_{102}$ are each independently a $C_2$-$C_{10}$ alkylene group, a $C_2$-$C_{10}$ alkenylene group, or a $C_2$-$C_{10}$ alkylene group or $C_2$-$C_{10}$ alkenylene group substituted with at least one of a halogen atom, a cyano group, a hydroxyl group, a $C_1$-$C_{10}$ alkyl group, or a $C_1$-$C_{10}$ alkoxy group;

$T_1$ and $T_2$ are each independently a $C_5$-$C_{30}$ aromatic ring system, a $C_2$-$C_{30}$ hetero aromatic ring system, or a $C_5$-$C_{30}$ aromatic ring system or $C_2$-$C_{30}$ hetero aromatic ring system substituted with at least one of a halogen atom, a cyano group, a hydroxyl group, a $C_1$-$C_{10}$ alkyl group, and a $C_1$-$C_{10}$ alkoxy group;

p is an integer of 1 through 10;

q is an integer of 0 through 10;

$R_{101}$ through $R_{106}$ are each independently a hydrogen atom, a halogen atom, a cyano group, a hydroxyl group, a $C_1$-$C_{10}$ alkyl group, a $C_1$-$C_{10}$ alkoxy group, a $C_1$-$C_{10}$ alkyl group substituted with at least one of a halogen atom, a cyano group, a hydroxyl group, a $C_5$-$C_{14}$ aryl group, and a $C_2$-$C_{14}$ hetero aryl group, a $C_1$-$C_{10}$ alkoxy group substituted with at least one of a halogen atom, a cyano group, a hydroxyl group, a $C_5$-$C_{14}$ aryl group, and a $C_2$-$C_{14}$ hetero aryl group,

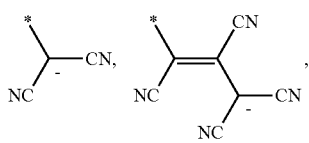

or —N($R_{107}$)($R_{108}$); $R_{107}$ and $R_{108}$ are each independently a hydrogen atom, a $C_1$-$C_{10}$ alkyl group, a phenyl group, or a biphenyl group; and $L_{101}$ is one of a $C_5$-$C_{14}$ arylene group, a $C_5$-$C_{14}$ hetero arylene group, and a $C_5$-$C_{14}$ arylene group or $C_5$-$C_{14}$ hetero arylene group substituted with at least one of a halogen atom, a cyano group, a hydroxyl group, a $C_1$-$C_{10}$ alkyl group, and a $C_1$-$C_{10}$ alkoxy group:

7. The organic light-emitting device as claimed in claim 6, wherein $X_1$ through $X_4$ are each independently a compound represented by Formula 30A or 30D.

8. The organic light-emitting device as claimed in claim 6, wherein $R_{103}$ is one of a hydrogen atom; a halogen atom; a cyano group; a $C_1$-$C_{10}$ alkyl group; a $C_1$-$C_{10}$ alkoxy group; a $C_1$-$C_{10}$ alkyl group or $C_1$-$C_{10}$ alkoxy group substituted with at least one of a halogen atom, a cyano group, a phenyl group, a naphthyl group, an anthryl group, a pyridinyl group, a thiophenyl group, and a benzothiophenyl group; or —N($R_{107}$)($R_{108}$), and wherein $R_{107}$ and $R_{108}$ are each independently a hydrogen atom, a $C_1$-$C_{10}$ alkyl group, a phenyl group, or a biphenyl group.

9. The organic light-emitting device as claimed in claim 6, wherein $R_{101}$ and $R_{102}$ are each independently a cyano group,

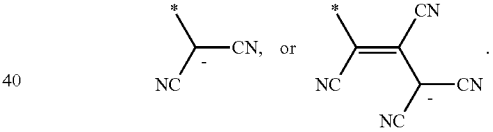

10. The organic light-emitting device as claimed in claim 6, wherein each of $A_1$ and $A_2$ is —S—.

11. The organic light-emitting device as claimed in claim 6, wherein $Q_{101}$ and $Q_{102}$ are each independently an ethylene group; a propylene group; an ethenylene group; a prophenylen group; an ethylene group substituted with at least one of a halogen atom, a cyano group, and a hydroxyl group; a propylene group substituted with at least one of a halogen atom, a cyano group, and a hydroxyl group; an ethenylene group substituted with at least one of a halogen atom, a cyano group, and a hydroxyl group; or a prophenylen group substituted with at least one of a halogen atom, a cyano group, and a hydroxyl group.

12. The organic light-emitting device as claimed in claim 6, wherein $T_1$ and $T_2$ are each independently benzene; naphthalene; anthracene; thiophene; thiadiazole; oxadiazole; or a benzene, naphthalene, anthracene, thiophene, thiadiazole, or oxadiazole substituted with at least one of a halogen atom, a cyano group, a $C_1$-$C_{10}$ alkyl group, and a $C_1$-$C_{10}$ alkoxy group.

13. The organic light-emitting device as claimed in claim 6, wherein p is 1.

14. The organic light-emitting device as claimed in claim 6, wherein q is 0, 1, or 2.

15. The organic light-emitting device as claimed in claim 6, wherein $L_{101}$ is one of a thiophenylene group; a benzothiophenylene group; a thiophenylene group substituted with at least one of a halogen atom, a cyano group, and a $C_1$-$C_{10}$ alkyl group; and a benzothiophenylene group substituted with at least one of a halogen atom, a cyano group, and a $C_1$-$C_{10}$ alkyl group.

16. The organic light-emitting device as claimed in claim 6, wherein the cyano group-containing compound is a compound represented by any one of Formulae 1A through 20B below:

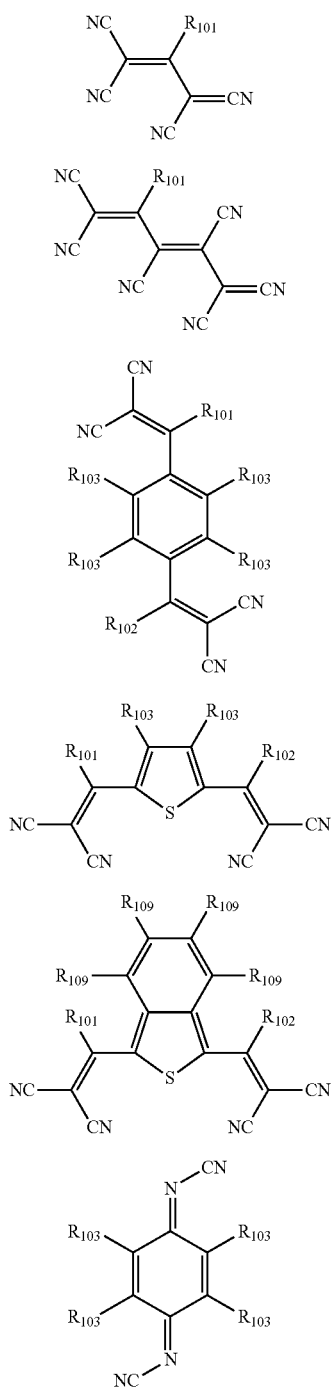

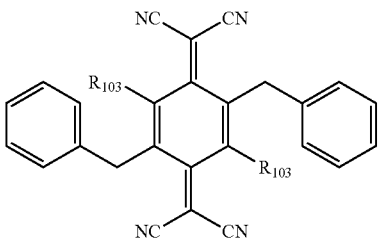

Formula 3B

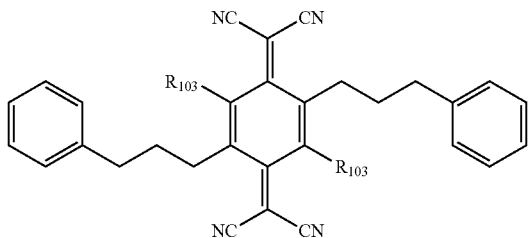

Formula 3C

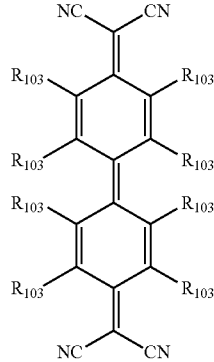

Formula 3D

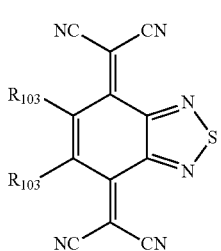

Formula 4A

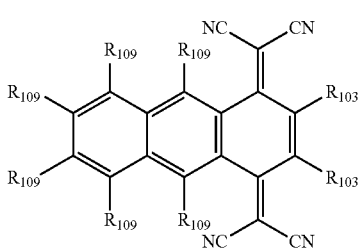

Formula 4B

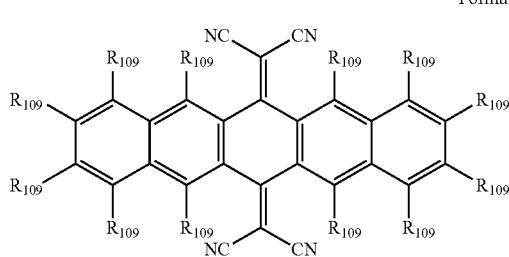

Formula 5A

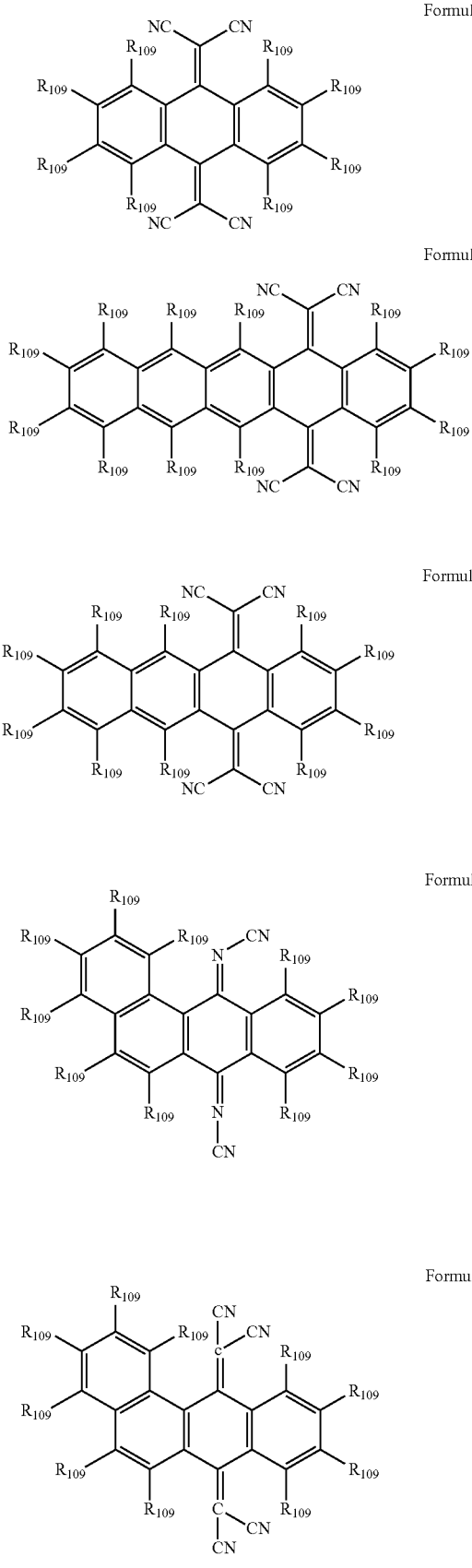
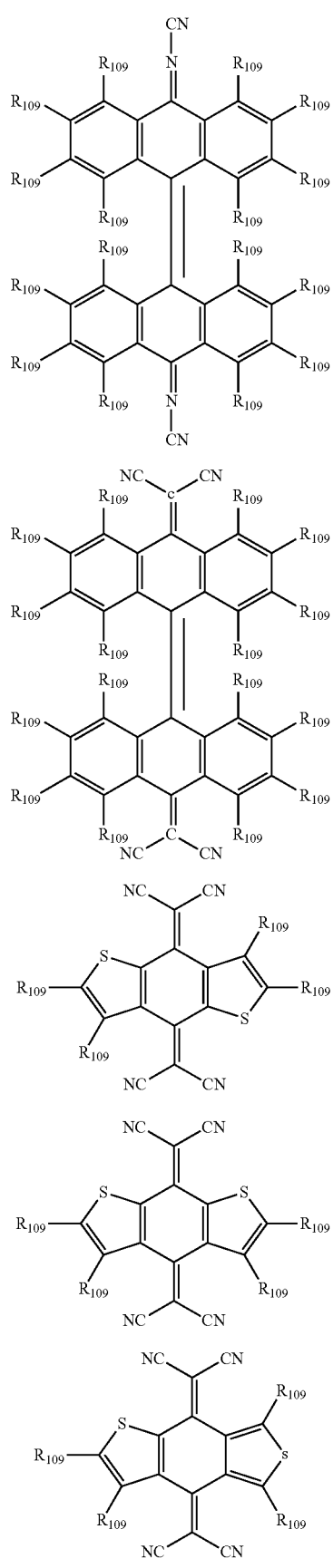

-continued

Formula 5L
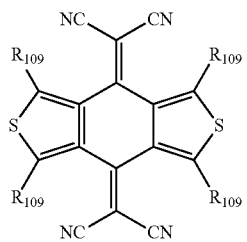

Formula 5M
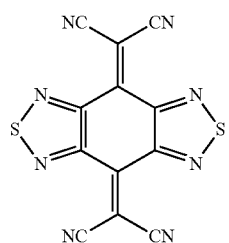

Formula 9A
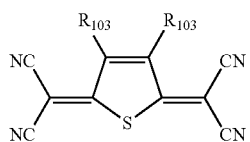

Formula 10A
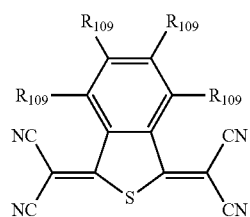

Formula 11A
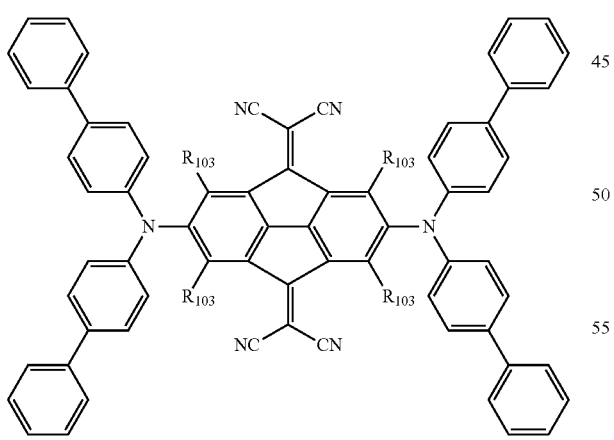

Formula 12A
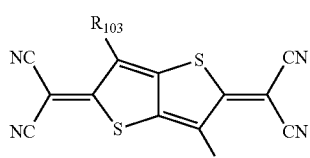

-continued

Formula 12B
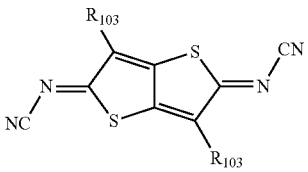

Formula 19A
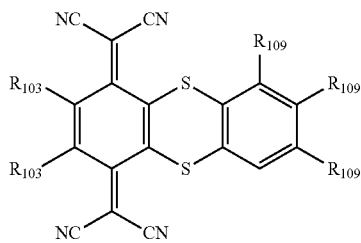

Formula 20A
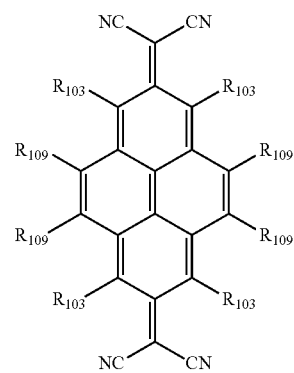

Formula 20B
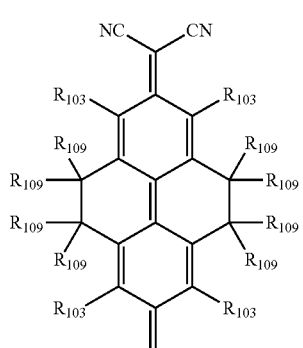

where $R_{103}$ and $R_{109}$ are each independently a hydrogen atom, —F, a cyano group, a methyl group, an ethyl group, a propyl group, an ethenyl group, a methoxy group, an ethoxy group, or a propoxy group.

17. The organic light-emitting device as claimed in claim 1, wherein $Ar_1$ and $Ar_{11}$ are each independently a $C_1$-$C_{10}$ alkylene group; a phenylene group; a naphthylene group; an anthrylene group; a fluorenylene group; a carbazolylene group; a pyrazolylene group; a pyridinylene group; a triazinylene group; —N($Q_1$)—; or a $C_1$-$C_{10}$ alkylene group, phenylene group, naphthylene group, anthrylene group, fluorenylene group, carbazolylene group, pyrazolylene group, pyridinylene group, or triazinylene group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group, wherein $Q_1$ is one of a hydrogen atom; a $C_1$-$C_{10}$ alkyl group; a $C_1$-$C_{10}$ alkoxy group; a phenyl group; a naphthyl group; a carbazolyl group; a fluorenyl group; a $C_1$-$C_{10}$ alkyl group, $C_1$-$C_{10}$ alkoxy group, phenyl group, naphthyl group, carbazolyl group, or pyrenyl group substituted with at least one substituent selected from the group consisting of a halogen atom, a cyano group, a hydroxyl group, a $C_1$-$C_{10}$ alkyl group, a $C_1$-$C_{10}$ alkoxy group, a phenyl group, a naphthyl group, and an anthryl group; and a fluorenyl group; or —N($Q_2$)($Q_3$).

18. The organic light-emitting device as claimed in claim 1, wherein $Ar_2$ and $Ar_{12}$ are each independently a hydrogen atom; a $C_1$-$C_{10}$ alkyl group; a phenyl group; a naphthyl group; a carbazolyl group; a fluorenyl group; a pyrenyl group; a $C_1$-$C_{10}$ alkyl group, $C_1$-$C_{10}$ alkoxy group, phenyl group, naphthyl group, carbazolyl group, fluorenyl group, or pyrenyl group substituted with at least one of a halogen atom, a cyano group, a hydroxyl group, a $C_1$-$C_{10}$ alkyl group, a $C_1$-$C_{10}$ alkoxy group, a phenyl group, a naphthyl group, and an anthryl group; or —N($Q_2$)($Q_3$), and wherein $Q_2$ and $Q_3$ are each independently a hydrogen atom, methyl, ethyl, phenyl, methylphenyl, biphenyl, naphthyl, or methylnaphthyl.

19. The organic light-emitting device as claimed in claim 1, wherein n and m are each independently 0, 1, 2, 3, 4, 5, or 6.

20. The organic light-emitting device as claimed in claim 16, wherein the cyano group-containing compound in the first layer is included in an amount of about 0.1 to about 20 parts by weight, based on 100 parts by weight of the first layer.

21. The organic light-emitting device as claimed in claim 1, wherein the first layer has a thickness of about 10 Å to about 2,100 Å.

22. The organic light-emitting device as claimed in claim 1, further comprising at least one of a hole injection layer and a hole transport layer between the first layer and the emission layer.

23. The organic light-emitting device as claimed in claim 1, wherein the Al-based reflective layer includes an $Al_x$Ni phase and x is about 2.5 to about 3.5.

24. The organic light-emitting device as claimed in claim 1, wherein the $Al_x$Ni phase, in which x is about 2.5 to about 3.5, contacts the transparent conductive layer.

25. The organic light-emitting device as claimed in claim 24, wherein x is 3.

26. The organic light-emitting device as claimed in claim 1, further comprising a nickel (Ni)-rich oxide layer on a surface of the Al-based reflective layer facing the transparent conductive layer.

27. The organic light-emitting device as claimed in claim 1, wherein the nickel (Ni) in the Al-based reflective layer is included in an amount of about 0.6 wt % to about 5 wt %.

28. The organic light-emitting device as claimed in claim 1, wherein the first element includes lanthanum (La).

29. The organic light-emitting device as claimed in claim 1, wherein the first element in the Al-based reflective layer is included in an amount of about 0.1 wt % to about 3 wt %.

30. The organic light-emitting device as claimed in claim 1, wherein the transparent conductive layer includes indium tin oxide (ITO) or tin oxide ($SnO_2$).

\* \* \* \* \*